US011935726B2

(12) United States Patent
Radomski et al.

(10) Patent No.: US 11,935,726 B2
(45) Date of Patent: Mar. 19, 2024

(54) HIGH SPEED SYNCHRONIZATION OF PLASMA SOURCE/BIAS POWER DELIVERY

(71) Applicants: MKS Instruments, Inc., Andover, MA (US); LAM RESEARCH CORPORATION, Fremont, CA (US)

(72) Inventors: Aaron T. Radomski, Conesus, NY (US); Benjamin J. Gitlin, Rochester, NY (US); Larry J. Fisk, II, Fairport, NY (US); Mariusz Oldziej, Avon, NY (US); Aaron M. Burry, Ontario, NY (US); Jonathan W. Smyka, Rochester, NY (US); Alexei Marakhtanov, Albany, CA (US); Bing Ji, Pleasanton, CA (US); Felix Leib Kozakevich, Sunnyvale, CA (US); John Holland, San Jose, CA (US); Ranadeep Bhowmick, San Jose, CA (US)

(73) Assignee: MKS Instruments, Inc., Andover, MA (US)

( * ) Notice: Subject to any disclaimer, the term of this patent is extended or adjusted under 35 U.S.C. 154(b) by 85 days.

(21) Appl. No.: 17/480,993

(22) Filed: Sep. 21, 2021

(65) Prior Publication Data
US 2022/0005674 A1    Jan. 6, 2022

Related U.S. Application Data

(63) Continuation of application No. 16/452,716, filed on Jun. 26, 2019, now Pat. No. 11,158,488.

(51) Int. Cl.
*H01J 37/32* (2006.01)

(52) U.S. Cl.
CPC ... *H01J 37/32183* (2013.01); *H01J 2237/334* (2013.01)

(58) Field of Classification Search
None
See application file for complete search history.

(56) References Cited

U.S. PATENT DOCUMENTS 6,707,255 B2    3/2004   Coumou et al.
7,602,127 B2    10/2009  Coumou
(Continued)

FOREIGN PATENT DOCUMENTS

CN    101147237 A    3/2008
CN    104124130 A    10/2014
(Continued)

OTHER PUBLICATIONS

European Office Action regarding European Patent Application No. 20831723.0, dated Feb. 2, 2022.
(Continued)

*Primary Examiner* — Srinivas Sathiraju
(74) *Attorney, Agent, or Firm* — Harness, Dickey & Pierce, P.L.C.

(57) ABSTRACT

A radio frequency (RF) generator system includes first and second RF power sources, each RF power source applying a respective RF signal and second RF signal to a load. The first RF signal is applied in accordance with the application of the second RF signal. The application of the first RF signal is synchronized to application of the second RF signal. The first RF signal may be amplitude modulated in synchronization with the second RF signal, and the amplitude modulation can include blanking of the first RF signal. A frequency offset may be applied to the first RF signal in synchronization with the second RF signal. A variable actuator associated with the first RF power source may be controlled in accordance with the second RF signal.

31 Claims, 17 Drawing Sheets

(56) References Cited

U.S. PATENT DOCUMENTS

| | | | |
|---|---|---|---|
| 7,727,413 B2 | 6/2010 | Paterson et al. | |
| 8,040,068 B2 | 10/2011 | Coumou et al. | |
| 8,110,991 B2 | 2/2012 | Coumou | |
| 8,154,209 B2 | 4/2012 | Marakhtanov et al. | |
| 8,395,322 B2 | 3/2013 | Coumou | |
| 8,576,013 B2 | 11/2013 | Coumou | |
| 8,781,415 B1* | 7/2014 | Coumou | H01J 37/32935 330/149 |
| 9,578,731 B2 | 2/2017 | Van Zyl | |
| 9,755,576 B2 | 9/2017 | Perreault et al. | |
| 9,779,953 B2 | 10/2017 | Aubuchon et al. | |
| 9,947,514 B2 | 4/2018 | Radomski et al. | |
| 10,083,818 B2 | 9/2018 | Khaja et al. | |
| 10,115,564 B2* | 10/2018 | Marakhtanov | H01J 37/32183 |
| 10,229,816 B2* | 3/2019 | Coumou | H01J 37/32183 |
| 10,297,422 B2 | 5/2019 | Sato | |
| 10,304,669 B1 | 5/2019 | Coumou et al. | |
| 10,354,838 B1 | 7/2019 | Mopidevi et al. | |
| 10,504,744 B1 | 12/2019 | Yanagawa et al. | |
| 10,546,724 B2 | 1/2020 | Radomski et al. | |
| 10,741,363 B1* | 8/2020 | Burry | H03K 5/00006 |
| 10,903,048 B2* | 1/2021 | Wu | H01J 37/32183 |
| 10,910,197 B2* | 2/2021 | Coumou | H01J 37/32183 |
| 11,158,488 B2* | 10/2021 | Radomski | H01J 37/32183 |
| 11,183,368 B2* | 11/2021 | French | C23C 16/4586 |
| 2004/0163594 A1* | 8/2004 | Windhorn | H01J 37/32082 118/723 E |
| 2006/0090854 A1* | 5/2006 | Sato | C03C 15/00 156/345.44 |
| 2009/0159439 A1* | 6/2009 | Pipitone | H01J 37/32944 204/298.03 |
| 2011/0031216 A1 | 2/2011 | Liao et al. | |
| 2012/0013253 A1 | 1/2012 | Coumou | |
| 2013/0222055 A1 | 8/2013 | Coumou et al. | |
| 2013/0260567 A1 | 10/2013 | Marakhtanov et al. | |
| 2014/0055034 A1 | 2/2014 | Coumou | |
| 2014/0263199 A1 | 9/2014 | Nelson et al. | |
| 2014/0265833 A1 | 9/2014 | Albarede | |
| 2014/0320013 A1 | 10/2014 | Coumou et al. | |
| 2015/0083582 A1 | 3/2015 | Dhindsa et al. | |
| 2015/0091440 A1 | 4/2015 | Marakhtanov et al. | |
| 2016/0086772 A1* | 3/2016 | Khaja | H01J 37/3211 315/111.21 |
| 2017/0018926 A1* | 1/2017 | Coumou | H01J 37/32899 |
| 2017/0054418 A1 | 2/2017 | Coumou et al. | |
| 2017/0062186 A1 | 3/2017 | Coumou et al. | |
| 2017/0062187 A1 | 3/2017 | Radomski et al. | |
| 2017/0125218 A1* | 5/2017 | Sato | H01J 37/32183 |
| 2017/0345620 A1* | 11/2017 | Coumou | H03J 7/08 |
| 2018/0330921 A1* | 11/2018 | Radomski | H01J 37/32146 |
| 2019/0108976 A1 | 4/2019 | Van Zyl | |
| 2019/0214231 A1 | 7/2019 | Fisk, II et al. | |
| 2019/0334385 A1 | 10/2019 | Luu et al. | |
| 2019/0341228 A1 | 11/2019 | Kaneko et al. | |
| 2019/0371573 A1* | 12/2019 | Gregor | H01J 37/32091 |
| 2020/0043703 A1* | 2/2020 | French | H01L 21/6833 |
| 2020/0098551 A1 | 3/2020 | Tian | |
| 2020/0118792 A1* | 4/2020 | Mopidevi | H01L 21/6831 |
| 2020/0126761 A1* | 4/2020 | Coumou | H01J 37/32183 |
| 2020/0185194 A1 | 6/2020 | Albarede et al. | |
| 2020/0411289 A1* | 12/2020 | Radomski | H01J 37/32183 |
| 2021/0050185 A1* | 2/2021 | Martinez | H01J 37/32183 |
| 2021/0313152 A1* | 10/2021 | Luo | H01J 37/3299 |
| 2022/0005674 A1* | 1/2022 | Radomski | H01J 37/32183 |
| 2022/0044909 A1* | 2/2022 | French | C23C 16/45565 |
| 2023/0050119 A1* | 2/2023 | Martinez | H03H 7/38 |
| 2023/0087307 A1* | 3/2023 | Guo | H01J 37/32146 315/111.21 |

FOREIGN PATENT DOCUMENTS

| | | |
|---|---|---|
| CN | 105103660 A | 11/2015 |
| CN | 107924806 A | 4/2018 |
| CN | 108140530 A | 6/2018 |
| EP | 2642661 A2 | 9/2013 |
| JP | 2018536295 A | 12/2018 |
| TW | 201616547 A | 5/2016 |
| TW | 201631621 A | 9/2016 |
| WO | WO-2018209085 A1 | 11/2018 |

OTHER PUBLICATIONS

International Search Report and Written Opinion Issued for Corresponding International Patent App. No. PCT/US2020/030067, dated Aug. 13, 2020.

First Office Action regarding Taiwanese Patent Application No. 109113702, dated Jun. 11, 2021.

Chinese Office Action regarding Patent Application No. 202080033868.5, dated Apr. 28, 2023.

Japanese Office Action regarding Patent Application No. 2021-566156, dated Jun. 5, 2023.

European Search Report regarding Application No. 20831723.0, dated Jul. 13, 2023.

Coumou David J. et al., "Ion Energy Distribution SKew Control Using Phase-Locked Harmonic RF Bias Drive" IEEE Transactions on Plasma Science, IEEE Service Center, Piscataway, NJ, US, vol. 42, No. 7, Jul. 1, 2014 (Jul. 1, 2014), pp. 1880-1893.

Singaporean Office Action regarding Patent Application No. 11202111579Y, dated Aug. 15, 2023.

* cited by examiner

US 11,935,726 B2

HIGH SPEED SYNCHRONIZATION OF PLASMA SOURCE/BIAS POWER DELIVERY

CROSS REFERENCE TO RELATED APPLICATION

This application is a continuation of U.S. patent application Ser. No. 16/452,716, filed Jun. 26, 2019. The entire disclosure of the above application is incorporated herein by reference.

FIELD

The present disclosure relates to RF control systems and to a RF control system to improve power delivery to a load.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Plasma etching is frequently used in semiconductor fabrication. In plasma etching, ions are accelerated by an electric field to etch exposed surfaces on a substrate. In one basic implementation, the electric field is generated based on Radio Frequency (RF) or Direct Current (DC) power signals generated by a respective RF or DC generator of a power delivery system. The power signals generated by the generator must be precisely controlled to effectively execute plasma etching.

SUMMARY

A radio frequency (RF) generator includes a RF power source. The RF generator also includes a RF power controller coupled to the RF power source. The RF power controller generates a control signal to vary a first RF output from the RF power source to a non-linear load. The RF power controller is configured to control at least one of the first RF output or an actuator in a first predetermined manner over a first predetermined portion of a second RF output applied to the non-linear load. The first predetermined manner includes controlling at least one of a power of the first RF output, a frequency of the first RF output, or a match network actuator associated with the first RF output.

A RF generator includes a first RF generator having a first power source generating a first RF signal applied to a load. The RF generator also includes a second RF generator, which includes a second power source generating a second RF signal applied to the load and a power controller coupled to the second power source. The power controller is configured to respond to a trigger signal and to generate a control signal to vary at least one of the second RF signal or an actuator, wherein the control signal adjusts an electrical parameter of the second RF signal. The electrical parameter includes at least one of a power of the second RF signal or a frequency of the second RF signal, and the actuator includes a match network actuator associated with the second RF signal.

A method for generating a RF signal includes coupling a power controller to the RF source, controlling a first RF generator to output a first RF output signal, and generating a control signal. The control signal varies an electrical characteristic of the first RF output signal in accordance with a trigger signal. The trigger signal varies in accordance with a second RF output and indicates predetermined portions of the second RF output. The electrical characteristic includes at least one of a power of the first RF output signal or a frequency of the first RF output signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

Figure 1:
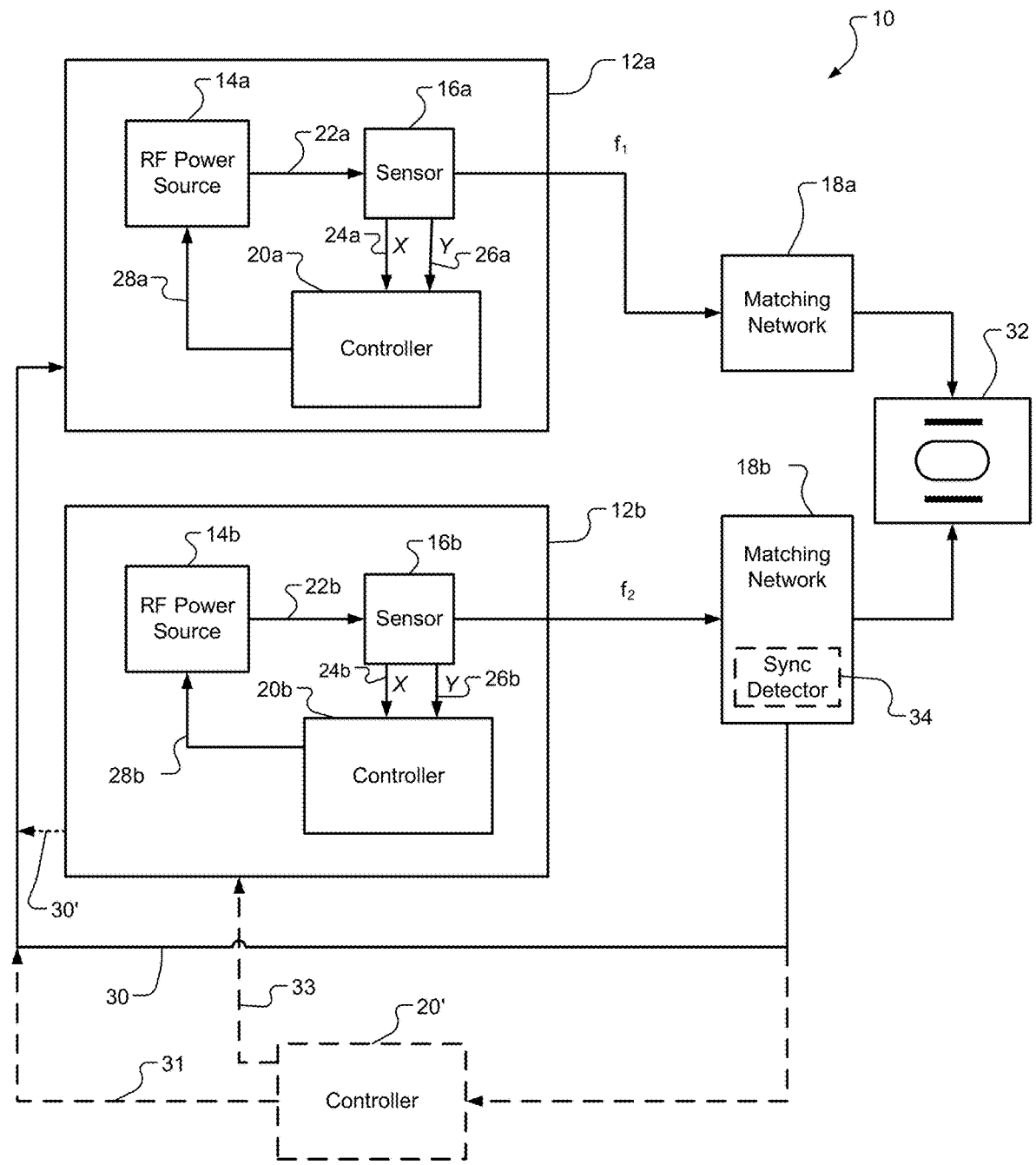
FIG. 1 is a schematic diagram of a power delivery system for multiple power supplies arranged in accordance with the present disclosure.

A power system may include an RF power generator, a matching network, and a load (e.g., a plasma chamber). The power generator generates an RF power signal, which is received by the matching network or impedance optimizing controller or circuit. The matching network or impedance optimizing controller or circuit matches an input impedance of the matching network to a characteristic impedance of a transmission line between the power generator and the matching network. This impedance matching aids in maximizing an amount of power forwarded to the matching network ("forward power") and minimizing an amount of power reflected back from the matching network to the power generator ("reverse power"). Forward power may be maximized and reverse power may be minimized when the input impedance of the matching network matches the characteristic impedance of the transmission line.

In a typical RF power generator configuration, output power applied to the load is determined by using sensors that measure the forward and reflected power or the voltage and current of the RF signal applied to the load. Either set of these signals is analyzed to determine the parameters of the power applied to the load. The parameters can include, for example, voltage, current, frequency, and phase. The analysis typically determines a power value which is used to adjust the output of the RF power supply in order to vary the power applied to the load.

In the RF power source or supply field, there are typically two approaches to applying the RF signal to the load. A first, more traditional approach is to apply a continuous wave signal to the load. In a continuous wave mode, the continuous wave signal is typically a sinusoidal wave that is output continuously by the power source to the load. In the continuous wave approach, the RF signal assumes a sinusoidal output, and the amplitude and/or frequency of the sinusoidal wave can be varied in order to vary the output power applied to the load.

A second approach to applying the RF signal to the load involves pulsing the RF signal, rather than applying a continuous wave signal to the load. In a pulse mode of operation, a RF sinusoidal signal is modulated by a modulation signal in order to define an envelope for the modulated sinusoidal signal. In a conventional pulse modulation scheme, the RF sinusoidal signal typically is output at a constant frequency and amplitude. Power delivered to the load is varied by varying the modulation signal, rather than varying the sinusoidal, RF signal.

In a typical RF power supply configuration, output power applied to the load is determined using sensors that measure the forward and reflected power or the voltage and current of the RF signal applied to the load. Either set of these signals is analyzed in a control loop. The analysis determines a power value which is used to adjust the output of the RF power supply in order to vary the power applied to the load. In a RF power delivery system, where the load is a plasma chamber, the varying impedance of the load causes a corresponding varying power applied to the load, as applied power is in part a function of the impedance of the load.

In plasma systems, power is typically delivered in one of two configurations. In a first configuration, the power is capacitively coupled to the plasma chamber. Such systems are referred to as capacitively coupled plasma (CCP) systems. In a second configuration, the power is inductively coupled to the plasma chamber. Such systems are typically referred to as inductively coupled plasma (ICP) systems. Plasma delivery systems typically include a bias and a source that apply respective bias power and a source power applied to one or a plurality of electrodes. The source power typically generates a plasma within the plasma chamber, and the bias power tunes the plasma to an energy relative to the bias RF power supply. The bias and the source may share the same electrode or may use separate electrodes, in accordance with various design considerations.

When a RF power delivery system drives a load in the form of a plasma chamber, the electric field generated by the power delivered to the plasma chamber results in ion energy within the chamber. One characteristic measure of ion energy is the ion energy distribution function (IEDF). The ion energy distribution function (IEDF) can be controlled with a RF waveform. One way of controlling the IEDF for a system in which multiple RF power signals are applied to the load occurs by varying multiple RF signals that are related by frequency and phase. The frequencies between the multiple RF power signals are locked, and the relative phase between the multiple RF signals is also locked. Examples of such systems can be found with reference to U.S. Pat. Nos. 7,602,127; 8,110,991; and 8,395,322; assigned to the assignee of the present invention and incorporated by reference herein.

RF plasma processing systems include components for plasma generation and control. One such component is referred to as a plasma chamber or reactor. A typical plasma chamber or reactor utilized in RF plasma processing systems, such as by way of example, for thin-film manufacturing, utilizes a dual frequency system. One frequency (the source) of the dual frequency system is typically a high frequency and controls the generation of the plasma, and the other frequency (the bias) of the dual frequency system is typically a low frequency and controls ion energy. Examples of dual frequency systems include systems that are described in U.S. Pat. Nos. 7,602,127; 8,110,991; and 8,395,322; referenced above. The dual frequency system described in the above-referenced patents requires a closed-loop control system to adapt RF power supply operation for the purpose of controlling ion density and its corresponding ion energy distribution function (IEDF).

By way of one non-limiting example, reactive-ion etching (RIE) is an etching technology used in microfabrication. RIE is typically characterized as dry etching. RIE uses a chemically reactive plasma to remove material deposited on wafers. The plasma is generated under low pressure (vacuum) by an electromagnetic field. High-energy ions from the plasma bombard the wafer surface and react with it to affect the etching process. In one example of a RIE system, a high frequency source RF power generator (for example, 13 MHz-100 MHz) creates a plasma, and a lower frequency bias RF generator (100 kHz-13 MHz) accelerates positive ions from the plasma to the substrate surface to control ion energy and etch anisotropy. In this example dual frequency drive system, the low frequency bias source introduces fluctuations in both the power and load impedance and into source RF generator.

One approach responsive to fluctuations in both the power and load impedance introduced into the source RF generator utilizes multiple source and bias generators to improve control of the plasma. In such a configuration, the plasma consists of a generally neutrally charged bulk region and a sheath region that oscillates near the surfaces of the vacuum chamber and substrate. The thickness of the sheath determines a significant portion of the plasma capacitance and is most affected by the low frequency bias power supply. The higher frequency source generator can be adversely affected by the sheath capacitance variation, resulting in large impedance and reflected power fluctuations. These fluctuations are usually too fast to be measured by present sensors and metrology systems.

As a result of the bias-induced capacitance fluctuations, little or no RF source power is delivered to the plasma when the reflected power is high. Conventional techniques address this limitation by increasing the power level of the source RF generator. Such a response carries with it significant control complexities and additional capital and operating costs. For example, when a RF source operates at an increased power, increased electrical stresses and a greater numbers of parts required to supply the higher power result in lower reliability of the RF generator. Further yet, such an approach impedes process reliability, as process repeatability and chamber matching are adversely affected because of parameters that cannot be reliably controlled, such as chamber RF parasitic impedances and RF amplifier component tolerances.

Multiple approaches exist for controlling a plasma chamber for generating plasmas. For example, phase and frequency of the driving RF signals may be used to control plasma generation. For RF driven plasma sources, the periodic waveform affecting plasma sheath dynamics and the corresponding ion energy is generally known and the frequency of the periodic waveforms and the associated phase interaction. Another approach involves dual frequency operation. That is, two RF frequency sources are used to power a plasma chamber to provide substantially independent control of ion and electron densities.

Another approach utilizes wideband RF power sources to drive a plasma chamber, but includes certain challenges. One challenge is coupling the power to the electrode. A second challenge is that the transfer function of the generated waveform to the actual sheath voltage for a desired IEDF must be formulated for a wide-process space to support material surface interaction. In one other approach, in an inductively coupled plasma, controlling power applied to a source electrode controls the plasma density while controlling power applied to the bias electrode controls the IEDF to provide etch rate control. By using source electrode and bias electrode control, the etch rate is controlled via the ion density and energy.

FIG. 1 depicts a RF generator or power supply system 10. Power supply system 10 includes a pair of radio frequency (RF) generators or power supplies 12a, 12b, matching networks 18a, 18b, and load, such as a non-linear load or plasma chamber 32. In various embodiments, RF generator 12a is referred to as a source RF generator or power supply, and matching network 18a is referred to as a source matching network. Also in various embodiments, RF generator 12b is referred to as a bias RF generator or power supply, and matching network 18b is referred to as a bias matching network.

Bias RF generator 12b generates a control signal 30 or 30' input to source RF generator 12a. As will be explained in greater detail, control signal 30 or 30' represents an input signal to power supply 12a that indicates one or more operating characteristics or parameters of bias RF generator 12b. A synchronization detector 34 senses the RF signal output from matching network 18b to load 32 and outputs a synchronization or trigger signal 30 to power supply 12a. In various embodiments, a synchronization or trigger signal 30' may be output from power supply 12b to power supply 12a, rather than trigger signal 30. A difference between trigger or synchronization signals 30, 30' is the effect of matching network 18b, which can change the phase between the input and output signals to matching network 18b. Signals 30, 30' include information about the operation of bias RF generator 12b that enables predictive responsiveness to address periodic fluctuations in the impedance of plasma chamber 32 caused by the bias generator 12b. When control signals 30 or 30' are absent, RF generators 12a, 12b operate autonomously.

RF generators 12a, 12b include respective RF power sources or amplifiers 14a, 14b, RF sensors 16a, 16b, and processors, controllers, or control modules 20a, 10b. RF power sources 14a, 14b generate respective RF power signals 22a, 22b output to respective sensors 16a, 16b. Sensors 16a, 16b receive the output of RF power sources 14a, 14b and generate respective RF power signals or RF power signals $f_1$ and $f_2$. Sensors 16a, 16b also output signals that vary in accordance with various parameters sensed from load 32. While sensors 16a, 16b, are shown within respective RF generators 12a, 12b, RF sensors 16a, 16b can be located externally to the RF power generators 12a, 12b. Such external sensing can occur at the output of the RF generator, at the input of an impedance matching device located between the RF generator and the plasma chamber, or between the output of the impedance matching device (including within the impedance matching device) and the plasma chamber.

Sensors 16a, 16b detect operating parameters of plasma chamber 32 and output signals X and Y. Sensors 16a, 16b may include voltage, current, and/or directional coupler sensors. Sensors 16a, 16b may detect (i) voltage V and current I and/or (ii) forward power $P_{FWD}$ output from respective power amplifiers 14a, 14b and/or RF generators 12a, 12b and reverse or reflected power $P_{REV}$ received from respective matching network 18a, 18b or load 32 connected to respective sensors 16a, 16b. The voltage V, current I, forward power $P_{FWD}$, and reverse power $P_{REV}$ may be scaled and/or filtered versions of the actual voltage, current, forward power, and reverse power associated with the respective power sources 14a, 14b. Sensors 16a, 16b may be analog and/or digital sensors. In a digital implementation, the sensors 16a, 16b may include analog-to-digital (A/D) converters and signal sampling components with corresponding sampling rates. Signals X and Y can represent any of the voltage V and current I or forward (or source) power $P_{FWD}$ reverse (or reflected) power $P_{REV}$.

Sensors 16a, 16b generate sensor signals X, Y, which are received by respective controllers or power control modules 20a, 10b. Power control modules 20a, 10b process the respective X, Y signals 24a, 26a and 24b, 26b and generate one or a plurality of feedback control signals 28a, 28b to respective power sources 14a, 14b. Power sources 14a, 14b adjust the RF power signals 22a, 22b based on the received feedback control signal. Power control modules 20a, 10b may include, at least, proportional integral derivative (PID) controllers or subsets thereof and/or direct digital synthesis (DDS) component(s) and/or any of the various components described below in connection with the modules. In various embodiments, power control modules 20a, 10b are PID controllers or subsets thereof and may include functions, processes, processors, or submodules. Feedback control signals 28a, 28b may be drive signals and may include DC offset or rail voltage, voltage or current magnitude, frequency, and phase components. In various embodiments, feedback control signals 28a, 28b can be used as inputs to one or multiple control loops. In various embodiments, the multiple control loops can include a proportional-integral-derivative (PID) control loop for RF drive, and for rail voltage. In various embodiments, feedback control signals 28a, 28b can be used in a Multiple Input Multiple Output (MIMO) control scheme. An example of a MIMO control scheme can be found with reference to U.S. application Ser. No. 15/974,947, filed May 9, 2018, entitled Pulsed Bidirectional Radio Frequency Source/Load and assigned to the assignee of the present application, and incorporated by reference herein.

In various embodiments, power supply system 10 can include controller 20'. Controller 20' may be disposed externally to either or both of RF generators 12a, 12b and may be referred to as external or common controller 20'. In various embodiments, controller 20' may implement one or a plurality of functions, processes, or algorithms described herein with respect to one or both of controllers 20a, 10b. Accordingly, controller 20' communicates with respective RF generators 12a, 12b via a pair of respective links 31, 33 which enable exchange of data and control signals, as appropriate, between controller 20' and RF generators 12a, 12b. For the various embodiments, controllers 20a, 20b, 20' can cooperatively provide analysis and control along with RF generators 12a, 12b. In various other embodiments, controller 20' can provide control of RF generators 12a, 12b, eliminating the need for the respective local controllers 20a, 10b.

In various embodiments, RF power source 14a, sensor 16a, controller 20a, and match network 18a can be referred to as source RF power source 14a, source sensor 16a, source controller 20a, and source matching network 18a. Similarly in various embodiments, RF power source 14b, sensor 16b, controller 10b, and match network 18b can be referred to as bias RF power source 14b, bias sensor 16b, bias controller 20b, and bias matching network 18b. In various embodiments and as described above, the source term refers to the RF generator that generates the plasma, and the bias term refers to the RF generator that tunes the plasma Ion Energy Distribution Function (IEDF) relative to the bias RF power supply. In various embodiments, the source and bias RF power supplies operate at different frequencies. In various embodiments, the source RF power supply operates at a higher frequency than the bias RF power supply.

In various embodiments, source controller 20a adjusts the frequency of RF signal $f_1$ to compensate for impedance fluctuations resulting from the application of RF signal $f_2$ to plasma chamber 32. In various embodiments, RF signal $f_2$ is a frequency lower than the frequency of RF signal h. The lower frequency causes periodic impedance fluctuations in plasma chamber 32, which appear as reflected intermodulation distortion (IMD). In various embodiments, and as will be described in greater detail herein, adjusting the timing of application of RF signal $f_1$, the source signal, in relation to RF signal $f_2$, the bias signal, enables an increase of delivered power at predetermined, desired portions of the RF signal $f_2$. As will further be described herein, the adjusting the power output of RF signal $f_1$ can include synchronizing power delivery of $f_1$ relative to $f_2$, increasing power at predetermined portions of RF signal $f_2$, decreasing or cutting off power of source RF signal $f_1$ at predetermined portions of bias RF signal $f_2$, or a combination thereof. In various embodiments, using the periodic nature of both RF signals $f_1$ and $f_2$, frequency offsets or hops can be added to RF signal $f_1$ to compensate for anticipated impedance fluctuations introduced by RF signal $f_2$. The power timing, power amplitude, and frequency offsets can be predetermined and stored in one or multiple lookup tables, or may be determined dynamically FIGS. 2-6 illustrate operation of FIG. 1 when controlled in a conventional manner. For example, in a conventional control approach, FIG. 1 may omit sync detector 34 and trigger or synchronization signals 30, 30'. In various conventional control approaches, power supplies 12a, 12b operate generally independently and output respective RF signals $f_1$, $f_2$ to load 32.

Figure 2:
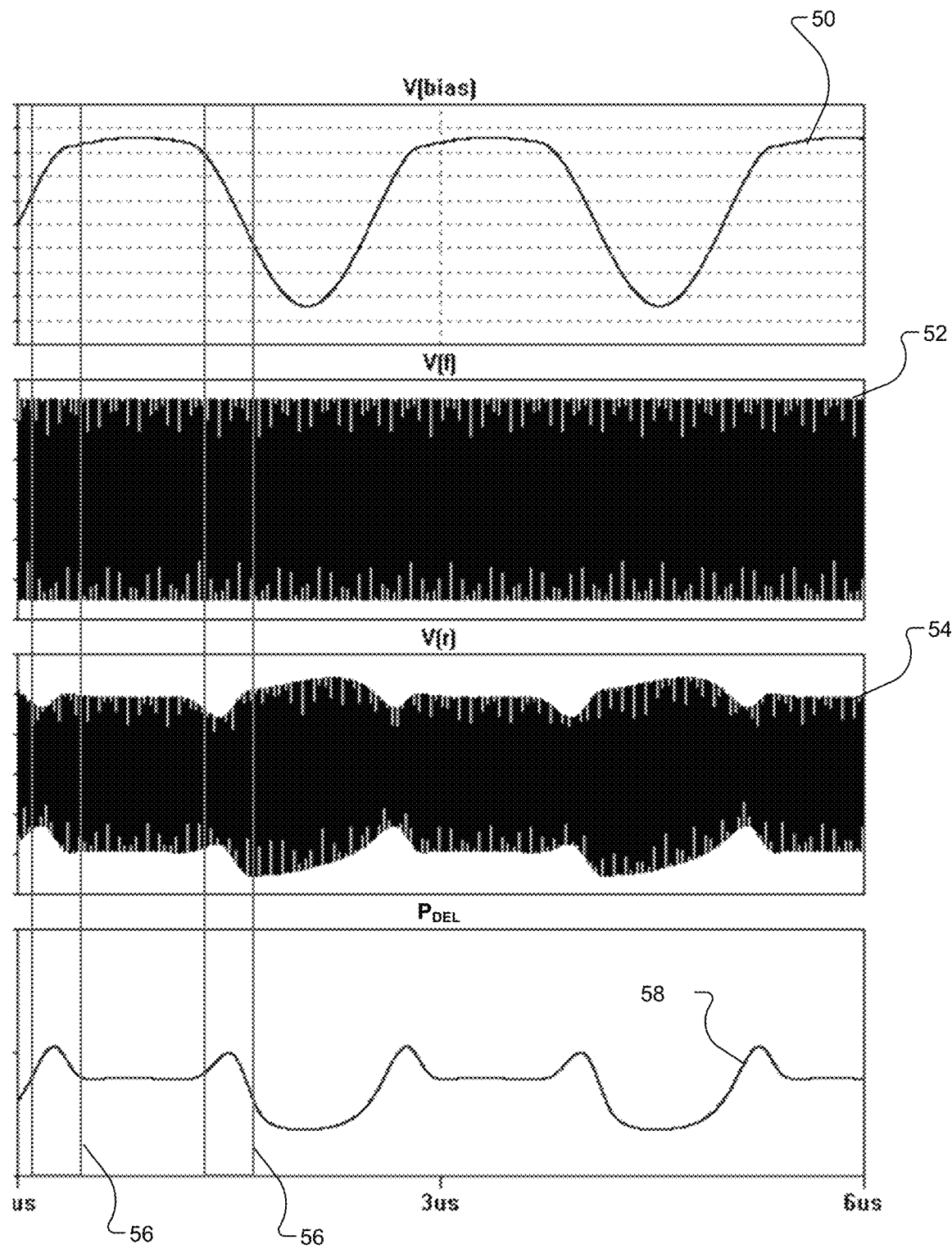
FIG. 2 is a plot of waveforms depicting a conventional approach to controlling a power delivery system having multiple power supplies.

FIG. 2 depicts waveforms of voltage versus time for a bias RF power supply, such as power supply 12b, a source RF power supply, such as power supply 12a, and power delivered to load 32 via source power supply 12a. As can be seen in FIG. 2, waveform 50 indicates the output from bias power supply 12b applied to load 32. In various embodiments, waveform 50 represents the waveform output by matching network 18b and applied to load 32. That is, matching network 18b can impact the waveform shape of RF signal $f_2$ input to matching network 18b.

FIG. 2 also depicts respective forward voltage waveforms $V_f$ 52 and reverse voltage waveform $V_r$ 54. With respect to forward voltage waveform 52 and reverse voltage waveform 54, since source RF power supply 12a operates at a significantly higher frequency than bias RF power supply 12b, voltage waveforms 52, 54 appear as envelopes because of the selected time scale of the x-axis for the waveforms of FIG. 2. Waveform 58 indicates the power delivered to load 32 by source RF power supply 12a, which is a net power resulting from application of $V_f$ and $V_r$. Rectangles 56, two of which are shown in FIG. 2, indicate sections of peak delivered power of $P_{DEL}$ of waveform 58. As can be seen, maximum power delivered $P_{DEL}$ appears within rectangles 56. Rectangles 56 thus indicate that maximum source power is delivered near the zero-crossings of bias waveform 50 of FIG. 2.

The waveforms of FIG. 2 are exemplary for a typical capacitive discharge system used to etch high aspect ratio (HAR) features for three-dimensional NAND/memory, dynamic random access memory (DRAM), or similar structures. The waveforms of FIG. 2 are representative of a system of narrowband power detectors that filter out reflected intermodulation distortion (IMD) products. The source amplifier is typically tuned via frequency and matching network capacitance to achieve a best average impedance, disregarding dynamic behavior of the plasma impedance. Examples of such a narrowband detector can be found with reference to U.S. Pat. No. 6,707,255, assigned to the assignee of the present invention and incorporated by reference herein.

Figure 3:
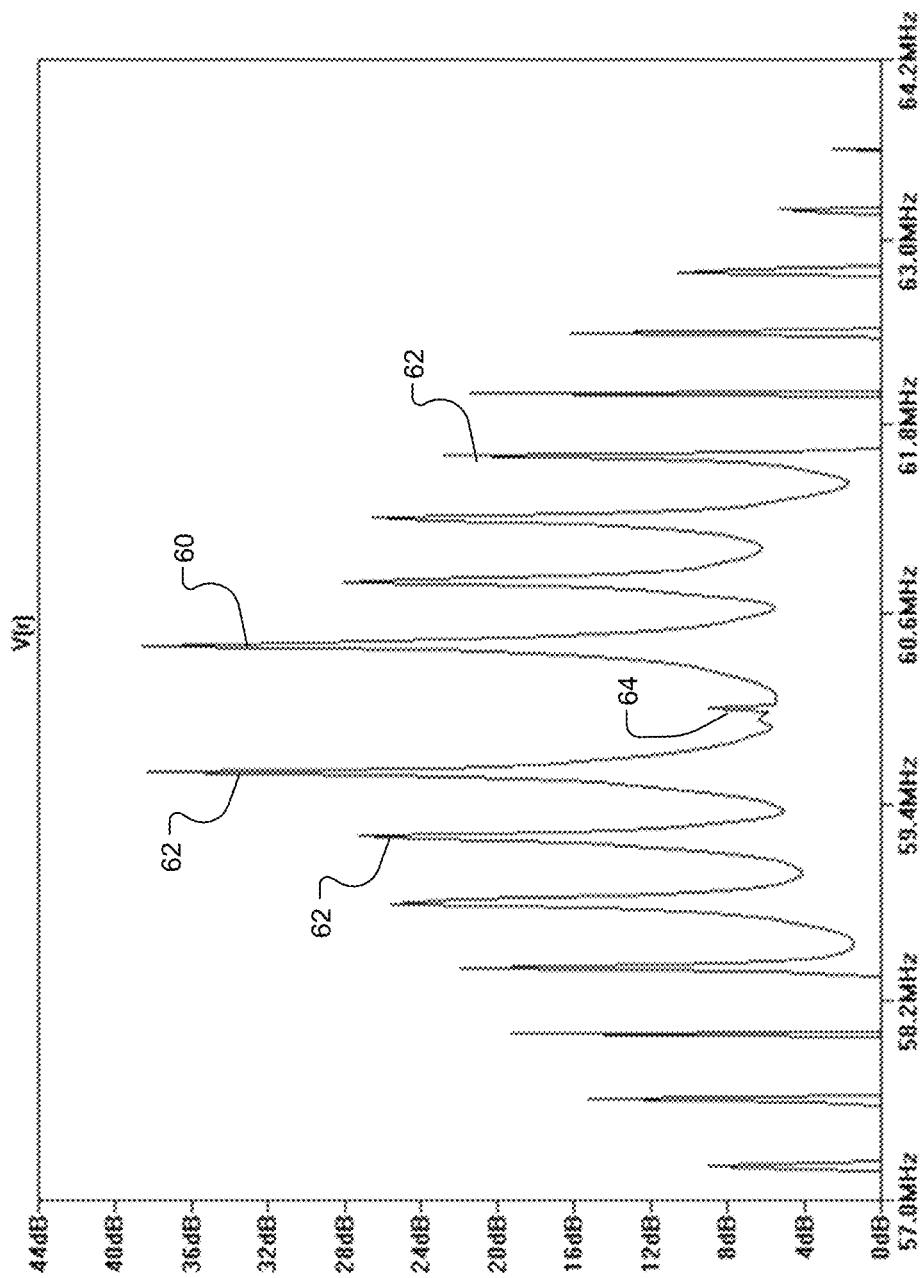
FIG. 3 is a plot of frequency versus reflected power for the higher frequency RF power supply of a power delivery system having high frequency and low frequency power supplies controlled in accordance with FIG. 2.

Waveform 60 of FIG. 3 indicates the reflected power spectrum for a conventional standard tuning. Waveform 60 of FIG. 3 represents a plot of reflected power versus frequency of the source RF generator 12a and includes several peaks 62, which indicate intermodulation distortion (IMD). In a conventional tuning using narrowband power detectors, however, IMD is filtered out since it is outside the bandwidth of the narrowband detector and thus matching networks or frequency tuning controllers do not recognize the IMD. In FIG. 2, the amplitude of the reflected power at the center frequency (60 mHz) is relatively low, as indicated at 64 since the matching network controller and frequency tuning controller of the generator are optimizing power delivery only at the fundamental. That is, conventional narrowband detector systems can mask the presence of the reflected power.

Figure 4:
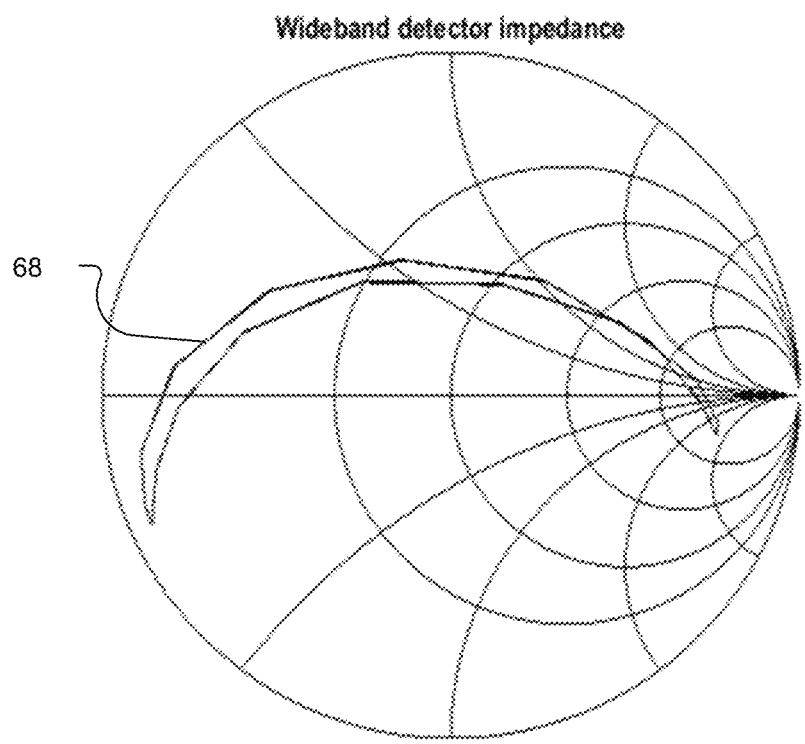
FIG. 4 is a Smith chart indicating impedance variation measured at the high frequency power supply by a wideband detector caused by one cycle of a low frequency power supply for a power delivery system controlled in accordance with FIG. 2.
Figure 5:
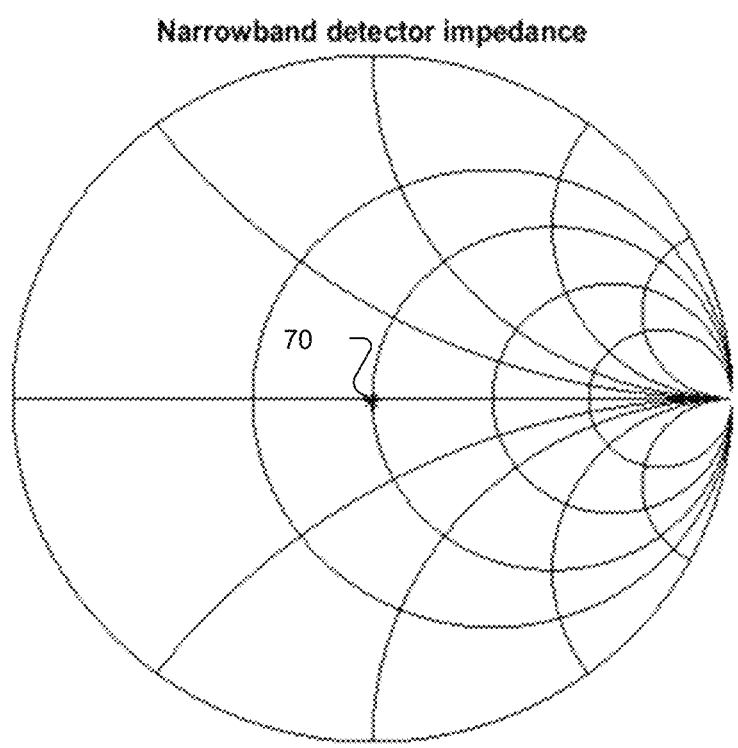
FIG. 5 is a Smith chart of impedance measured at the high frequency power supply measured by a narrowband detector for a power delivery system controlled in accordance with FIG. 2.

FIG. 4 represents a Smith chart representation of the source generator load impedance in the system of FIG. 2 measured using a wideband detector. The plot 68 in FIG. 4 represents the impedance measured at the output of source RF generator 12a when, for example, operating at 60 mHz, while bias RF generator 12b operates at 400 kHz. The plot 68 is the periodic impedance seen over one cycle of 2.5 microseconds. FIG. 5, on the other hand, represents the impedance measured at the source of RF generator 12a when utilizing a narrowband detector that filters out IMD. As can be seen, the measured impedance appears as a single point 70 appearing at the center of the Smith chart of FIG. 5.

Figure 6:
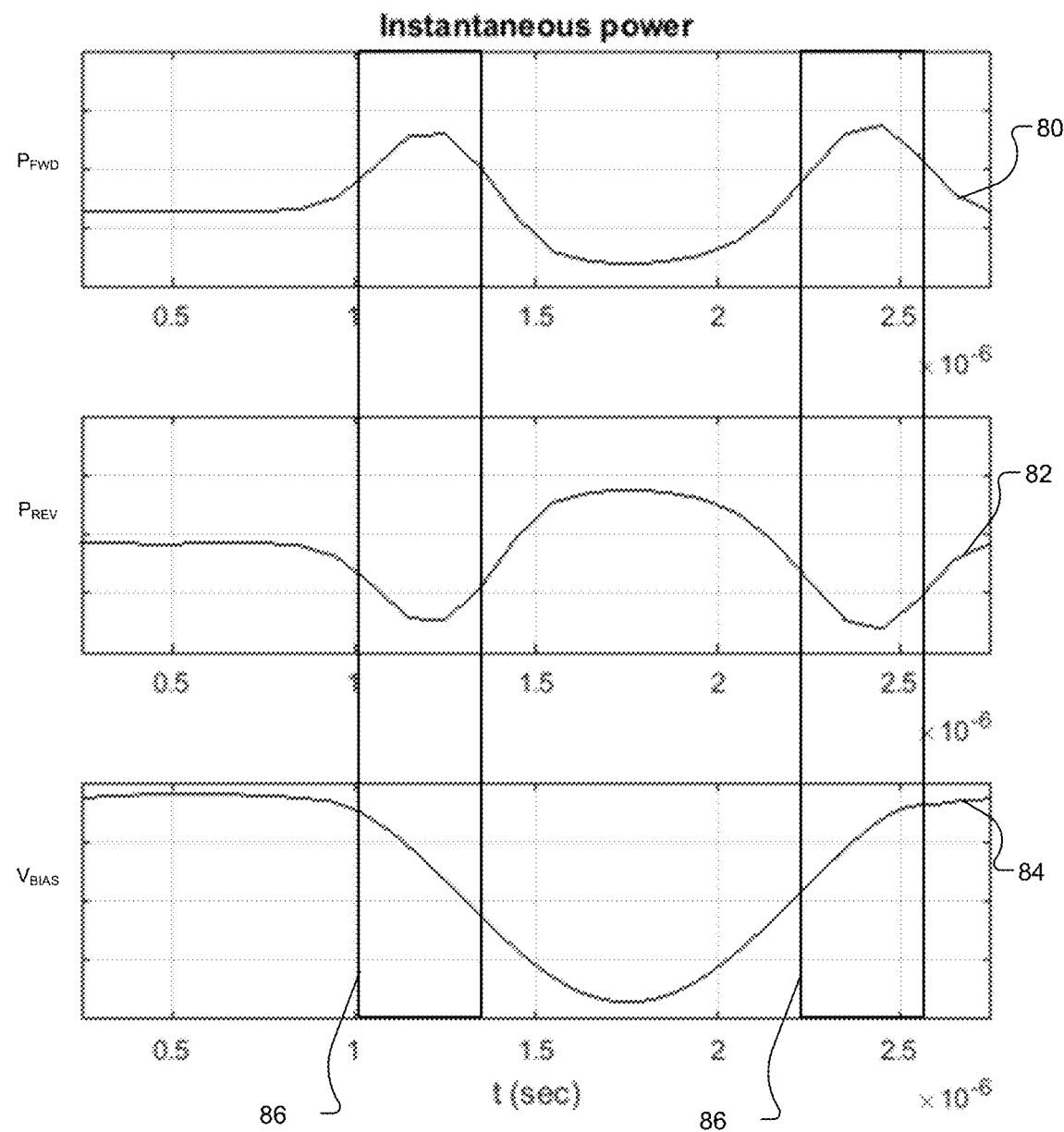
FIG. 6 is a plot of waveforms depicting forward and reverse power at the high frequency power supply in relation to the output of the low frequency power supply for a power delivery system controlled in accordance with FIG. 2.

FIG. 6 conveys similar information as in FIG. 2, but shows waveforms representative of forward source power $P_{FWD}$ 80, reverse source power $P_{REV}$ 82, and bias voltage $V_{BIAS}$ 84. As shown by rectangle 86, delivered power appears at a maximum where the forward power waveform 80 is at a maximum within rectangles 86, reverse power $P_{REV}$ is at a minimum of waveform 82 in rectangle 86. Referring to waveform 84, the maximum power delivered thus appears at zero-crossings of the bias voltage waveform $V_{BIAS}$ using $P_{FWD}$ is as a maximum and $P_{REV}$ is at a minimum.

In view of the foregoing observations, it is desirable to maximize power delivered by the source and minimize power reflected to the source. Accordingly when high speed plasma dynamics are considered (that is, plasma dynamics that cannot easily be measured) it is beneficial to selectively tune the source RF delivery system to deliver power during specific portions of the bias RF signal $f_2$. The source RF power $f_1$ is primarily used to impart energy to electrons, which in turn disassociate the feed gas into a mix of radicals and ions. The ions, because they are charged particles, can be accelerated by the lower frequency bias voltage $f_2$ to effect physical and chemical changes at the substrate surface. Thus, it may be desirable to deliver high source power when the bias voltage is highly negative and reduce the source power at other times.

Figure 7:
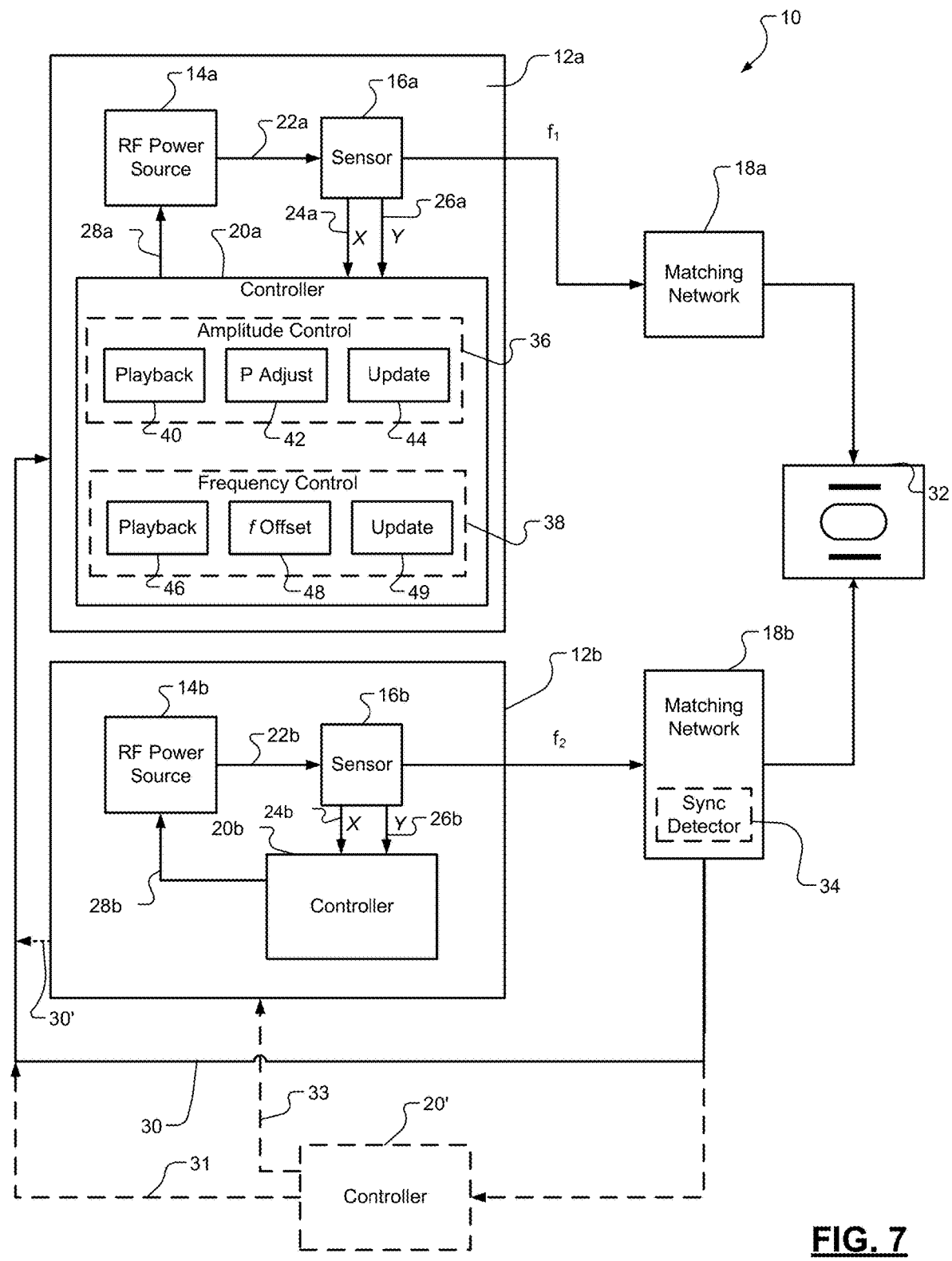
FIG. 7 is a schematic diagram of a power delivery system having multiple power supplies arranged in accordance with the present disclosure.

FIG. 7 depicts an expanded block diagram of FIG. 1 in which controller 20a includes an amplitude control section 36 and a frequency control section 38. Amplitude control section 36 includes a playback module 40, a power adjustment module 42, and an update module 44. Frequency control section 38 includes a playback module 46, a frequency offset module 48, and an update module 49. Each module 40, 42, 44 or 46, 48, 49 can be implemented collectively or individually as a process, a processor, a module, or a submodule. Further, each module 40, 42, 44 or 46, 48, 49 can be implemented as any of the various components described below in connection with the term module. Playback modules 40, 46 monitor for a triggering event or signal with which to synchronize the application of respective power, power adjustments, or frequency offsets to RF signal h. Once playback modules 40, 46 detect a triggering event or signal, playback modules 40, 46, respectively, initiate the addition of respective power and frequency offsets to RF signal h. Playback modules 40, 46 cooperate with respective power adjustment module 42 and frequency offset module 48. Power adjustment module 42 and frequency offset module 48 provide respective power and frequency adjustments to respective update modules 44, 49, which coordinate the application of respective power adjustment and frequency offset to RF signal $f_1$.

In various embodiments, power adjust module 42 and frequency offset module 48 may be implemented as respective lookup tables (LUTs). The respective power adjustments (both timing and amplitude) and frequency adjustments (offset or hops) are determined in accordance with, for example, a timing or synchronization relative to a triggering event or signal. Given the periodic nature of bias RF signal $f_2$ and the expected periodic impedance fluctuations that occur in response to application of RF signal $f_2$ to load 32, a LUT of the adjustments or offsets for RF signal $f_1$ can be determined. The power adjustments or frequency offsets or hops added to RF signal $f_1$ are generated to align with the dynamic impact on load 32 introduced by RF generator 12b and one or both improves the efficiency of operation of load 32 through selective and coordinated power deciphered by RF source generator 12a and at least partially cancels the bias RF interference, thereby reducing impedance fluctuations. In various embodiments, the LUT can be statically determined by experimentation, or automatically adjusted with an update process, such as with update modules 44, 49. In various other embodiments, the power adjustments and frequency adjustments can be determined dynamically.

Figure 8:
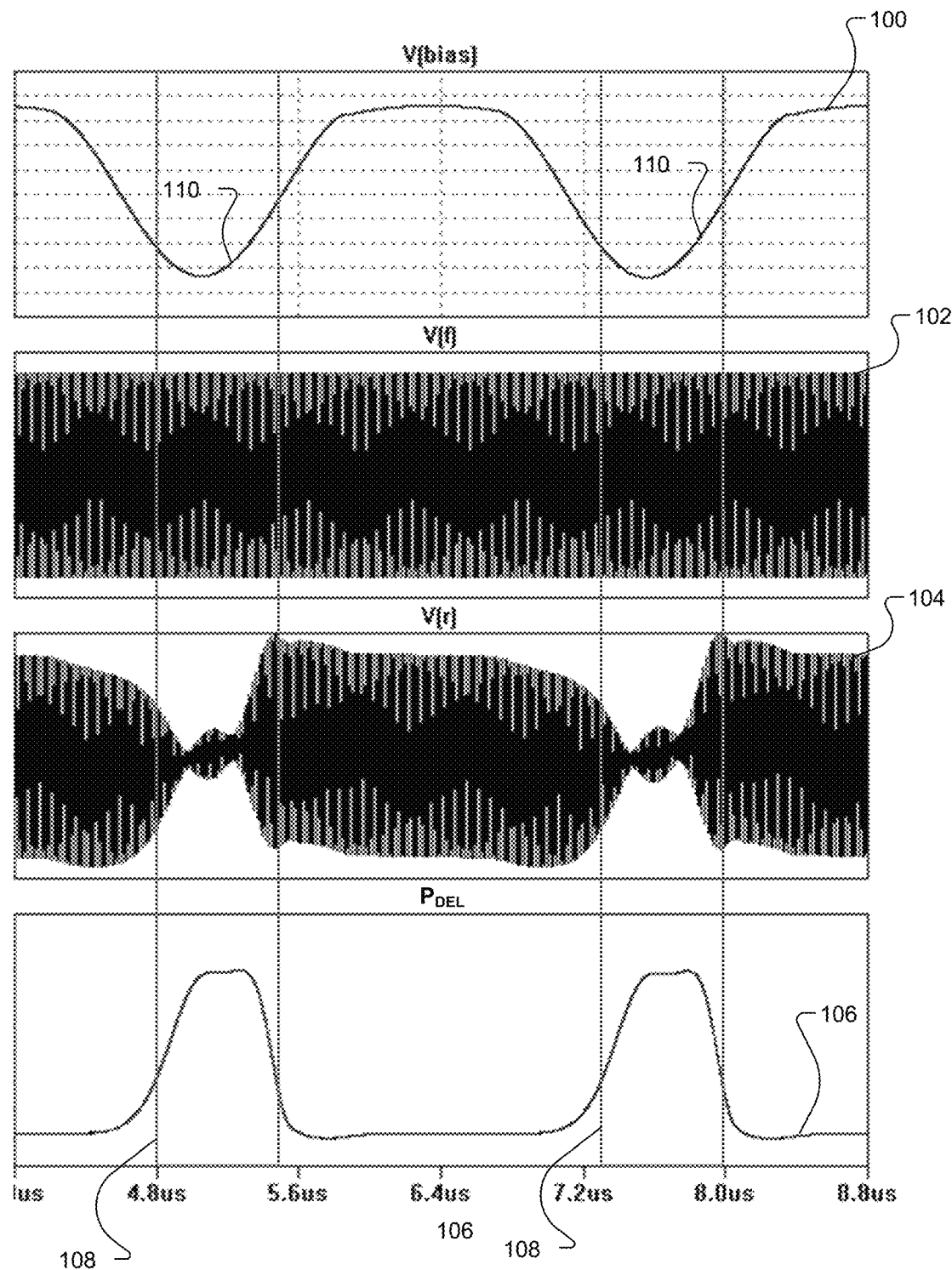
FIG. 8 is a plot of waveforms depicting an approach to controlling a power delivery system having multiple power supplies according to various embodiments.

FIG. 8 depicts waveforms similar to FIG. 2, but with the source generator 12a controlled with respect to operation of the bias generator 12b. As can be seen and will be explained in greater detail with respect to FIGS. 8-12, power delivery can be controlled by synchronization or timing of power, amplitude, or both, applied by source RF generator 12a relative to bias RF generator 12b. In FIG. 8, waveform 100 represents the bias voltage $V_{BIAS}$ applied to load 32. Waveform 100 is similar in shape to waveform 50 of FIG. 2. Waveforms 102 and 104 represent the respective forward source voltage $V_f$ and reverse source voltage $V_r$. By way of comparison, the forward source voltages $V_f$ and reverse voltages $V_r$ of FIGS. 2 and 8 operate at the same frequency. However, the source match is adjusted such that the reflected voltage 104 is minimized with respect to the bias voltage $V_{BIAS}$ waveform 100, as shown at segment no, yielding an increased delivered power $P_{DEL}$ shown at waveform 106. Rectangles or regions 108 indicate a maximum source power $P_{DEL}$ delivered to load 32. As can be seen at rectangles 108, the maximum delivered power $P_{DEL}$ occurs during the negative half cycles of $V_{BIAS}$ 100, as indicated at no.

Figure 9:
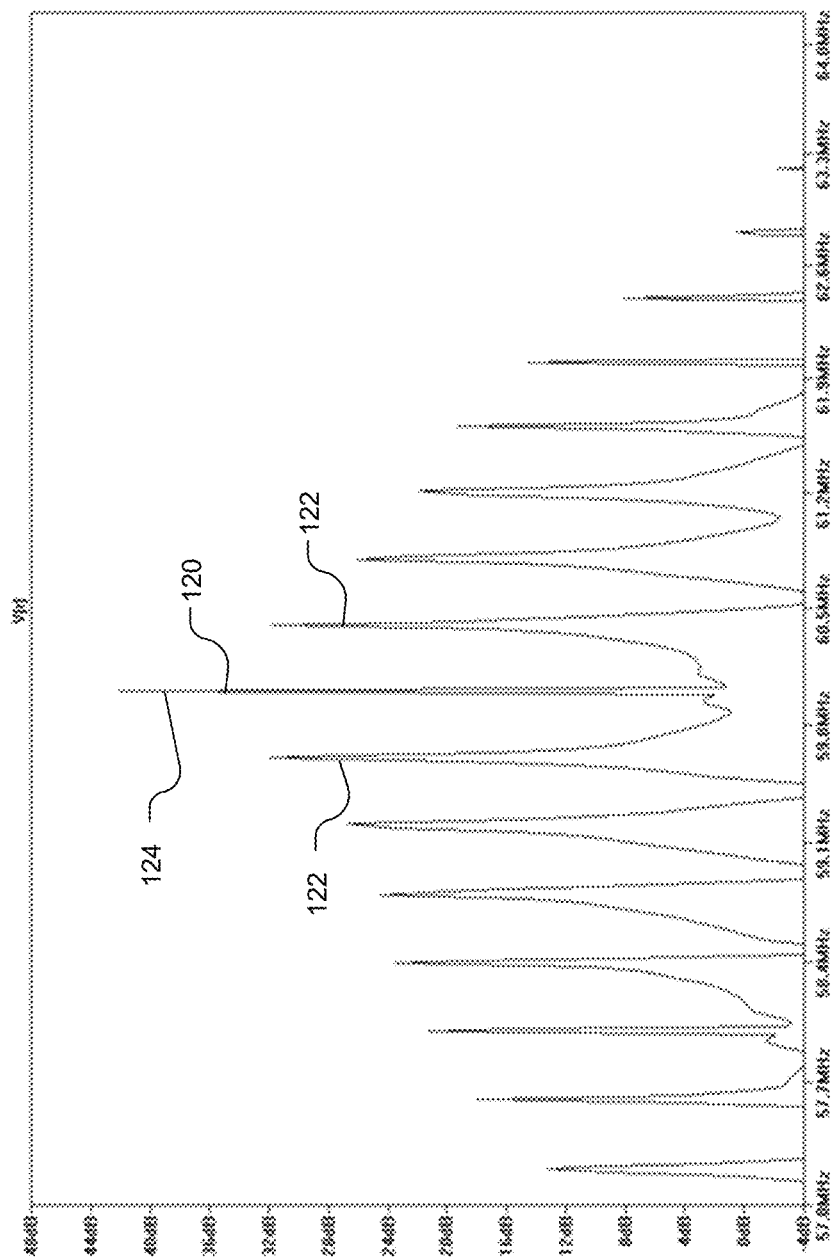
FIG. 9 is a plot of frequency versus reflected power for the higher frequency RF power supply of a power delivery system having a high frequency and low frequency power supplies controlled in accordance with FIG. 8.

FIG. 9 depicts a plot of reflected power spectrum plotted with respect to frequency. Waveform 120 includes a number of peaks, including peaks 122 indicating IMD. FIG. 9 also includes a peak 124 at approximately 60 MHz, which is the frequency of the source power supply 12a. By way of comparison to FIG. 3, in FIG. 3, no peak appears at 60 mHz, such as peak 64 in FIG. 3. A source delivery system according to a conventional approach attempts to minimize reflected power at the 60 MHz center frequency and thus would be unable to maximize power at the negative peak 110 (of FIG. 8) of the bias waveform. By synchronizing the application of source power at the impedance detector with the bias waveform $V_{BIAS}$, the source match settings and source frequency can be adjusted to maximize delivered source power in the desired time region 110 of the bias waveform. Thus, by synchronizing the source voltage waveform to the bias voltage waveform, peak power can be achieved at arbitrary locations relative to the bias waveform. This additional control may be used to manipulate the plasma properties to improve etch rate, selectivity, etc. Controlling for maximum power delivery at the negative peak of the bias is one embodiment. Various other embodiments include maximizing power delivery near the positive peak or any other desirable location, including varying the width of regions 108.

From FIG. 9, the presence of IMD in the detected signal can enable a more complete assessment of the overall reflected power. Accordingly, sensors 16a, 16b may be implemented using wideband detectors, thereby enabling detection of IMD products. Processing of wideband detector signals may be accomplished with reference to U.S. patent application Ser. No. 15/876,189, filed Jan. 21, 2018, entitled Adaptive Counter Measure Control Thwarting IMD Jamming Impairments for RF Plasma Systems, assigned to the assignee of the present application, and incorporated by reference herein.

Figure 10:
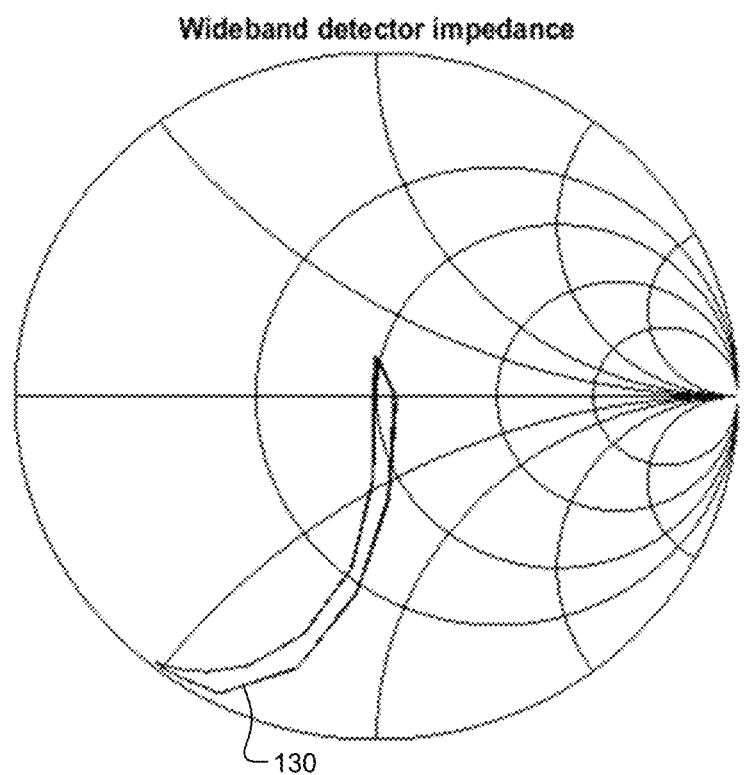
FIG. 10 is a Smith chart indicating impedance variation measured at the high frequency power supply by a wideband detector caused by one cycle of a low frequency power supply for a power delivery system controlled in accordance with FIG. 8.
Figure 11:
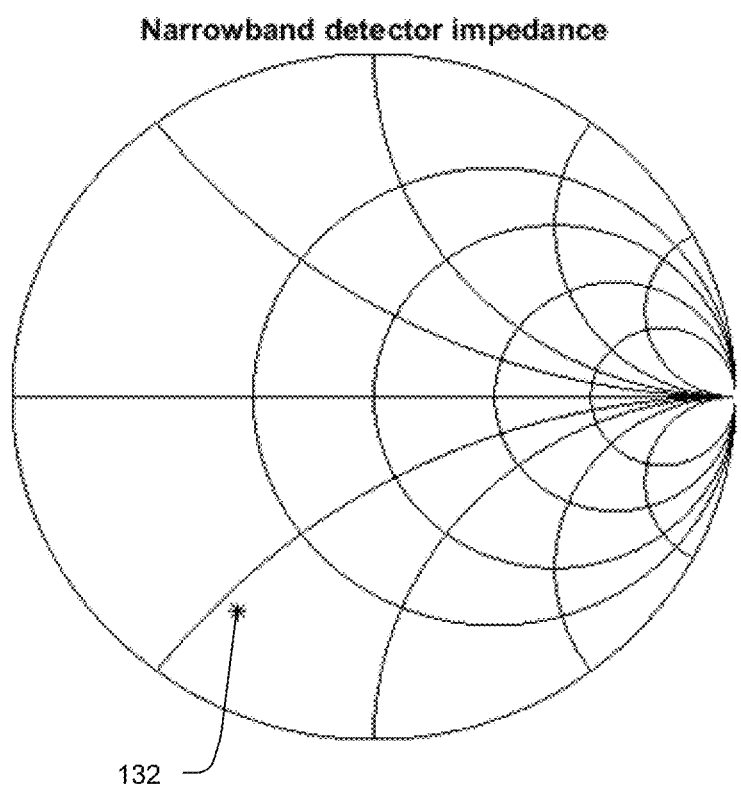
FIG. 11 is a Smith chart of impedance measured at the high frequency power supply by a narrowband detector for a power delivery system controlled in accordance with FIG. 8.

FIGS. 10 and 11 depict Smith charts for respective wideband detector impedance and narrowband detector impedance at source RF generator 12a. As can be seen in FIG. 10, the plot 68 from FIG. 4 has been rotated as shown at plot 130 in FIG. 10. The rotation indicates a minimized impedance for selected portions of the plot 130 near the center of the Smith chart. The rotation and position of plot 130 of FIG. 10 provides guidance as to during what position of $V_{BIAS}$, $V_f$ should be applied, that is, where an improved impedance match occurs. The portion of plot 130 near the center of the Smith chart corresponds to the negative half cycle of $V_{BIAS}$. FIG. 11 depicts the impedance 132 as detected with a narrowband detector. Thus, implementing the control approach described with respect to FIG. 8 shifts the plot 70 from FIG. 5 for the narrowband detector impedance to 132 of FIG. 11.

Figure 12:
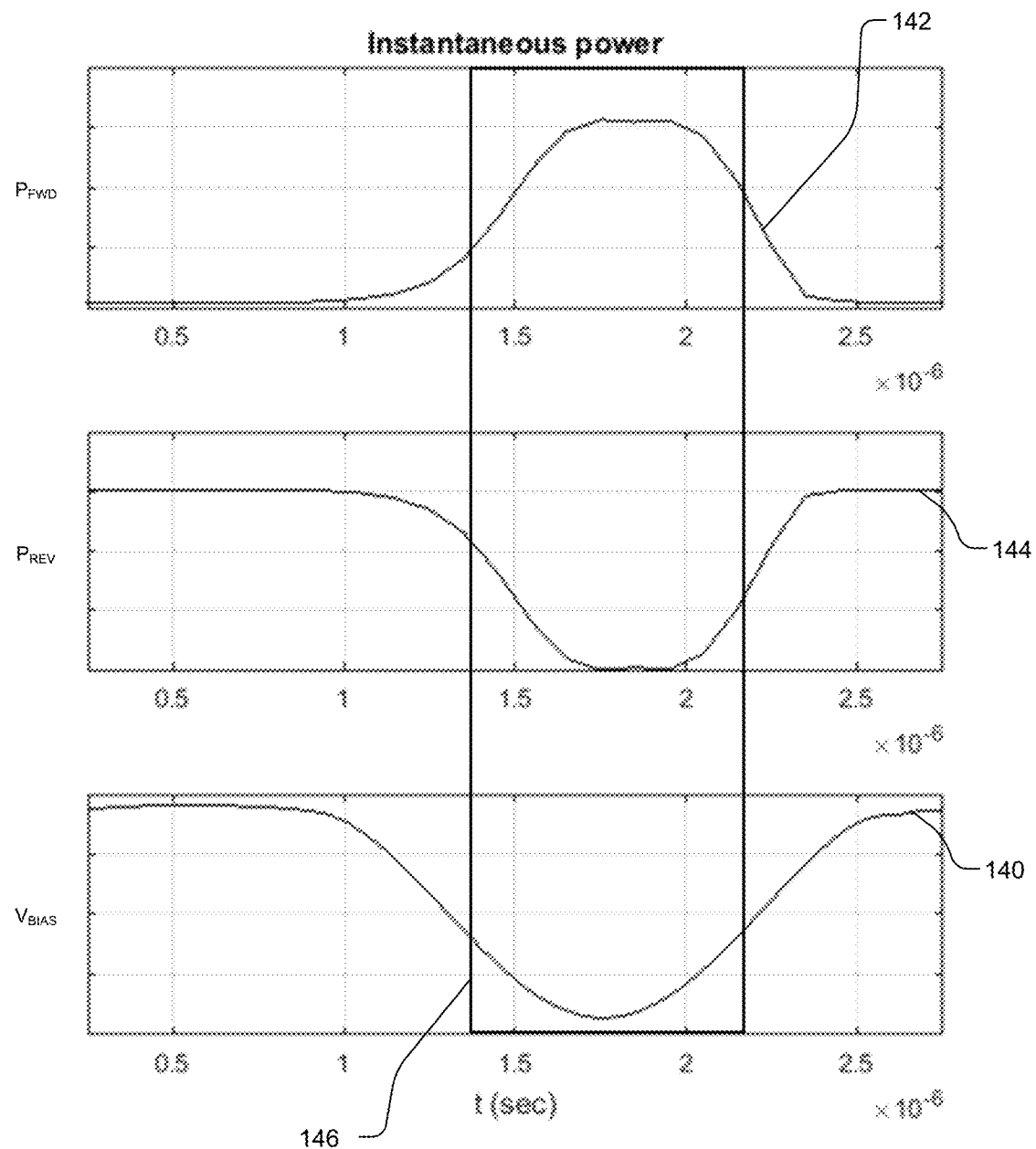
FIG. 12 are plots of forward and reverse power at the high frequency power supply in relation to the output of the low frequency power supply for a power delivery system controlled in accordance with FIG. 8.

FIG. 12 depicts a view similar to FIG. 6. In FIG. 12, waveform 140 indicates the bias voltage $V_{BIAS}$ output by bias RF generator 12b. Waveform 142 indicates the forward power $P_{FWD}$ output by source RF generator 12a, and waveform 144 represents the reverse power at RF source generator 12a. Rectangle 146 indicates that for a negative half cycle of $V_{BIAS}$, maximum forward power is delivered, as shown at waveform 142, and minimum reverse power occurs within rectangle 146, as shown at waveform 144.

Figure 13:
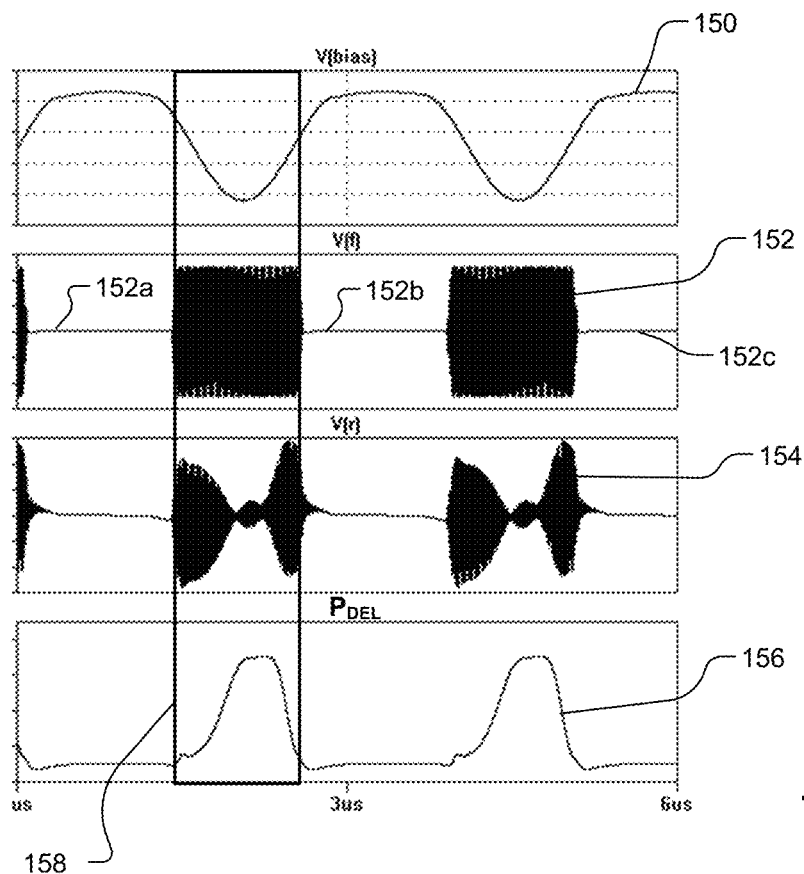
FIG. 13 is a plot of waveforms depicting an approach to controlling a power delivery system having multiple power supplies according to various embodiments.

FIGS. 13-16 indicate yet a further approach to controlling RF source generator 12a relative to RF bias generator 12b. In the approach of FIGS. 13-16, source RF generator 12a can be operated in a blanking or amplitude modulation mode in which different source voltages $V_f$ are applied during different portions of the bias voltage $V_{BIAS}$. FIG. 13 depicts a voltage $V_{BIAS}$ 150, a source forward voltage $V_f$ 152, a source reverse voltage $V_r$ 154, and a delivered power $V_{PDEL}$ 156. In FIG. 13, rectangle 158 indicates a predetermined region, such as a negative half cycle of $V_{BIAS}$ 150, during which RF source generator 12a is activated to output voltage $V_f$. FIG. 13 depicts two such half cycles during which source RF generator 12a is activated to output a forward voltage $V_f$. Source forward voltage $V_f$ is synchronized to $V_{BIAS}$, thereby reducing the reverse voltage $V_r$ within rectangle 158. During periods other than during the predetermined portions of bias voltage $V_{BIAS}$, such as half cycles of $V_{BIAS}$, the source forward voltage $V_f$ is reduced or turned off (blanked), as shown at portions 152a, 152b, 152c, reducing the source power applied over the corresponding regions $V_{BIAS}$ cycle. While the forward voltage $V_f$ is shown as turned off during portions 152a, 152b, 152c, other modulation envelopes can be used other than a complete on or off approach. Such modulation envelopes can include trapezoidal, Gaussian, and sinusoidal. One benefit of the significant power reduction can be seen with respect to the reverse voltage $V_r$ 154 during portions 152a, 152b, 152c. As can be seen, the reverse voltage $V_r$ is minimized during this period. Minimization of the reverse voltage can reduce stress on the source generator in addition to facility power and cooling load reduction while maintaining processing power for periods where maximum source power is beneficial for thin film processing.

Figure 14:
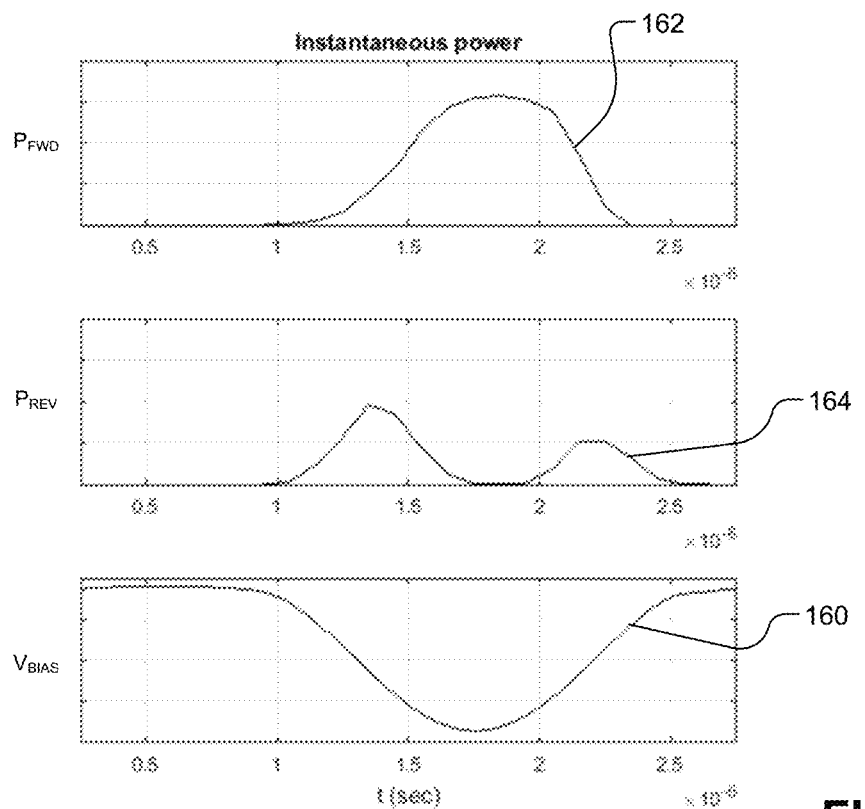
FIG. 14 are plots of forward and reverse power at the high frequency power supply in relation to the output of the low frequency power supply for a power delivery system controlled in accordance with FIG. 13.

FIG. 14 depicts a representation of FIG. 13 from a power perspective of the source RF power supply 12a. As shown in FIG. 14, $V_{BIAS}$ waveform 160 represents the bias voltage applied to load 32. The forward power waveform $P_{FWD}$ 162 represents the forward power applied to load 32 by source RF power supply 12a, and source reverse power $P_{REV}$ waveform 164 indicates the reverse power detected at source RF power supply 12a. As can be seen, during the negative path cycle of $V_{BIAS}$ 160, the forward power $P_{FWD}$ is maximized and the reverse power $P_{REV}$ is thus minimized.

In various embodiments, in addition to synchronization and power control, the impedance match between RF source generator 12a and load 32 can be dynamically adjusted in order to reduce reflected power during transitions of the bias waveform. Such dynamic matching can occur by varying the source generator frequency, such as by using automatic frequency tuning or varying a reactance within match network 18a.

Figure 15:
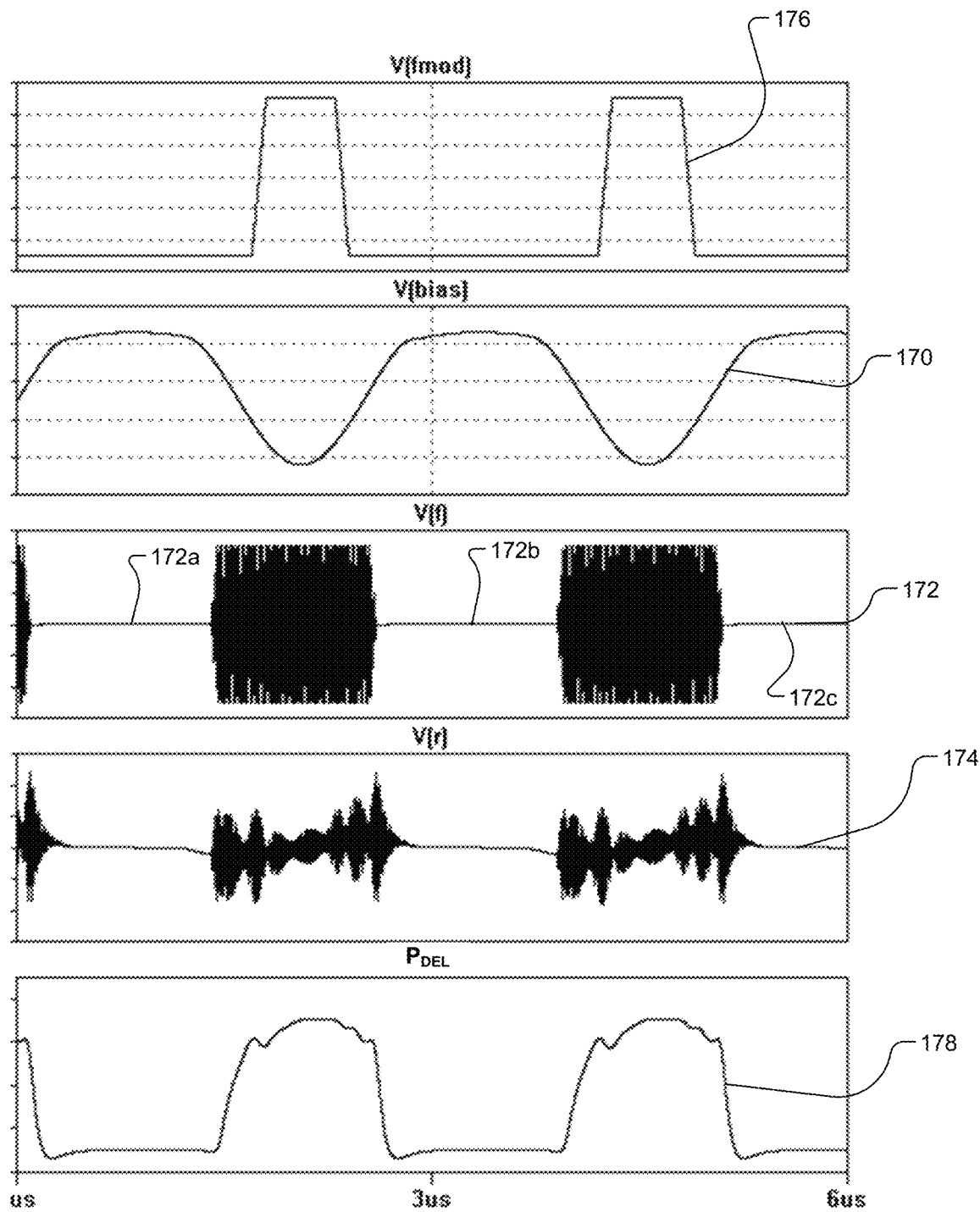
FIG. 15 is a plot of waveforms depicting an approach to controlling a power delivery system having multiple power supplies according to various embodiments.
Figure 16:
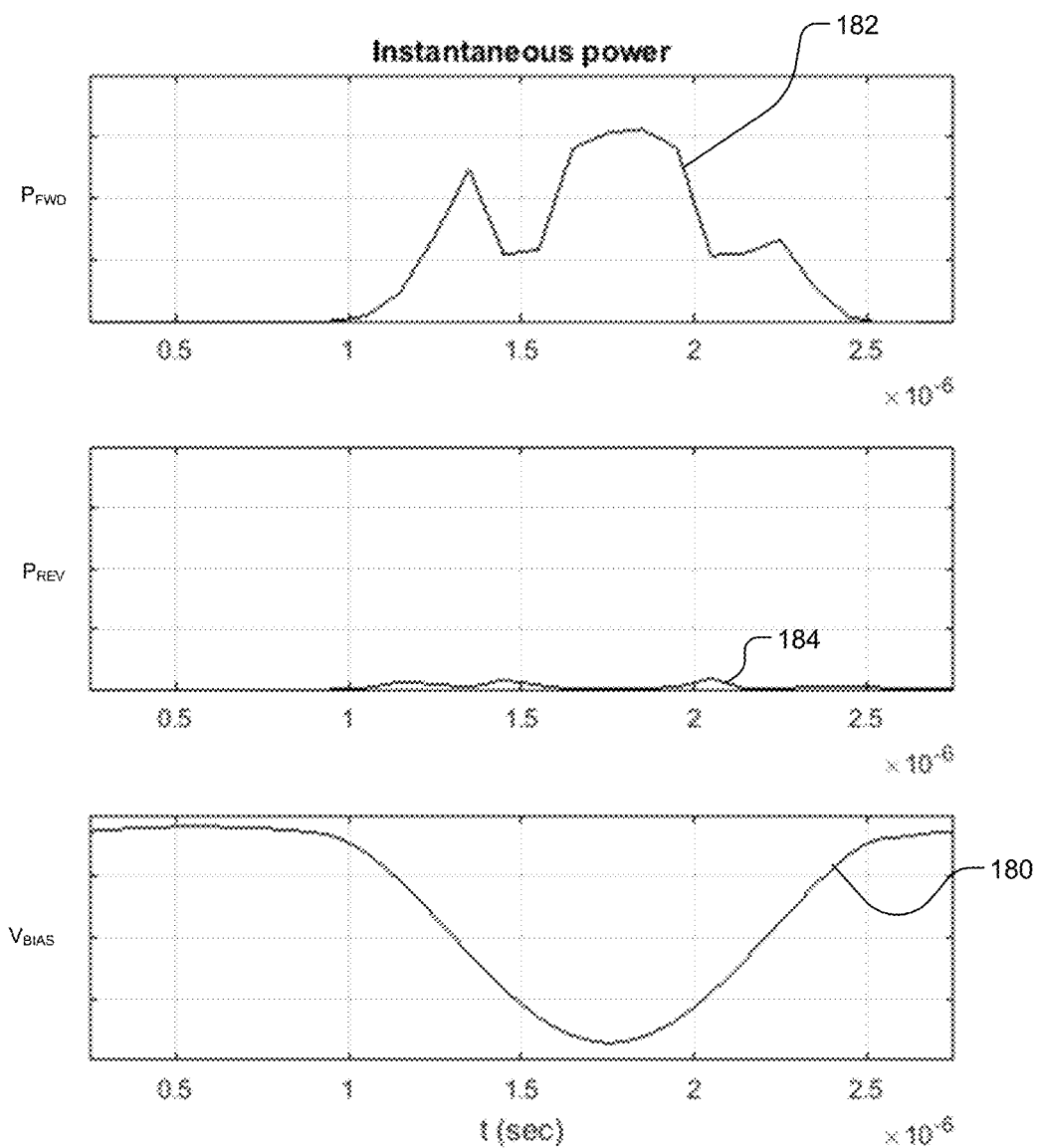
FIG. 16 are plots of forward and reverse power at the high frequency power supply in relation to the output of the low frequency power supply for a power delivery system controlled in accordance with FIG. 15.

FIGS. 15-16 depict waveforms for a system in which the source RF generator 12a and bias RF generator 12b are operated using power synchronization, power modulation, and frequency tuning. In FIG. 15, waveform 170 represents the bias voltage $V_{BIAS}$ applied to load 32. Waveform 172 represents the source forward voltage $V_f$ applied to load 32, and waveform 174 represents the reflected voltage $V_r$ returned to source RF generator 12a from load 32. The source forward voltage $V_f$ is controlled with respect to a predetermined portion of the $V_{BIAS}$ waveform, such as the negative half wave of the bias voltage $V_{BIAS}$. Waveform 172 also indicates power modulation of the source forward voltage $V_f$, such as blanking described above, during portions 172a, 172b, and 172c of forward voltage waveform $V_f$ 172. Waveform 174 indicates the source reverse voltage $V_r$ when controlling the source RF generator with respect to the bias RF generator as described above. The voltage delivered $V_{PDEL}$ waveform 178 indicates the voltage delivered to load 32.

FIG. 15 also depicts a modulation signal $V_{fmod}$ 176 which modulates the $V_f$ waveform output from source RF generator 12a. Modulation signal $V_{fmod}$ 176 introduces a frequency offset or hop to the output of source RF generator 12a, where the frequency offset effects frequency tuning to improve the impedance match. One benefit of the application of modulation signal $V_{fmod}$ 176 is improved delivered voltage as shown at $V_{PDEL}$ 178. With reference to voltage waveform $V_{PDEL}$ 156 of FIG. 13, it can be seen that a higher, sustained $V_{PDEL}$ 178 is achieved in FIG. 15. A further discussion of applying a frequency offset of hop can be found with reference to U.S. Pat. No. 9,947,514, issued Apr. 17, 2018, assigned to the assignee of the present application, and incorporated by reference herein.

FIG. 16 depicts a representation of FIG. 15 described from a delivered power perspective. FIG. 16 includes a bias voltage waveform $V_{BIAS}$ 180 a source forward power $P_{FWD}$ waveform 182, and source reverse power $P_{REV}$ 184. As can be seen in FIG. 16, the reverse power waveform $P_{REV}$ 184 is minimized, while the forward power $P_{FWD}$ 182 is maximized during the negative portion of the bias voltage waveform $V_{BIAS}$ 180.

Figure 17:
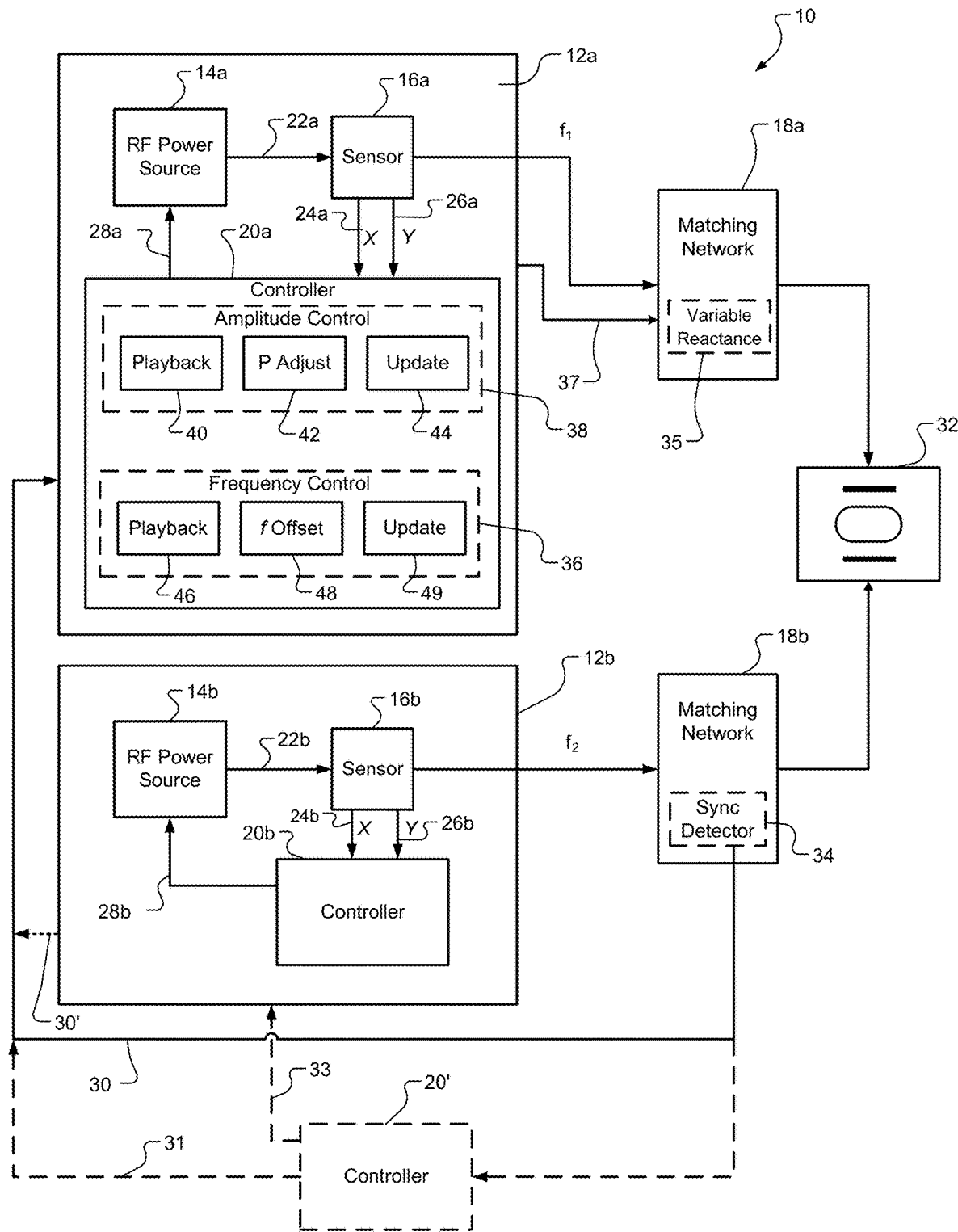
FIG. 17 is a schematic diagram of a power delivery system for multiple power supplies similar to FIG. 7 and also including control of a variable reactance of a matching network.

FIG. 17 depicts a block diagram similar to FIG. 7, and like reference numerals used in FIGS. 1 and 7 will be used to describe similar components in FIG. 17. Such similar components will not be described herein. FIG. 17 includes a variable actuator or reactance 35, which may be implemented as a variable capacitance or a variable inductance. Variable reactance 35 of matching network 18a may be varied by a control signal 37 generated by controller 20a of source RF generator 12a.

While FIGS. 15 and 16 describe a frequency offset or hopping method in which a frequency offset is added to the source forward voltage $V_f$, in various embodiments, dynamic tuning can be achieved by adjusting variable reactance 35 of matching network 18a in accordance with a control signal 37 generated by controller 20a. Thus, in various embodiments, controller 20a, rather than generating a frequency offset or hop for automatic frequency tuning, generates a command signal 37 to adjust variable actuator or reactance element 35 of matching network 18a. Thus, a result similar to that provided by the automatic frequency tuning described with respect to FIGS. 15 and 16 can be achieved by dynamically adjusting the variable reactance 35 of match network 18a.

Figure 18:
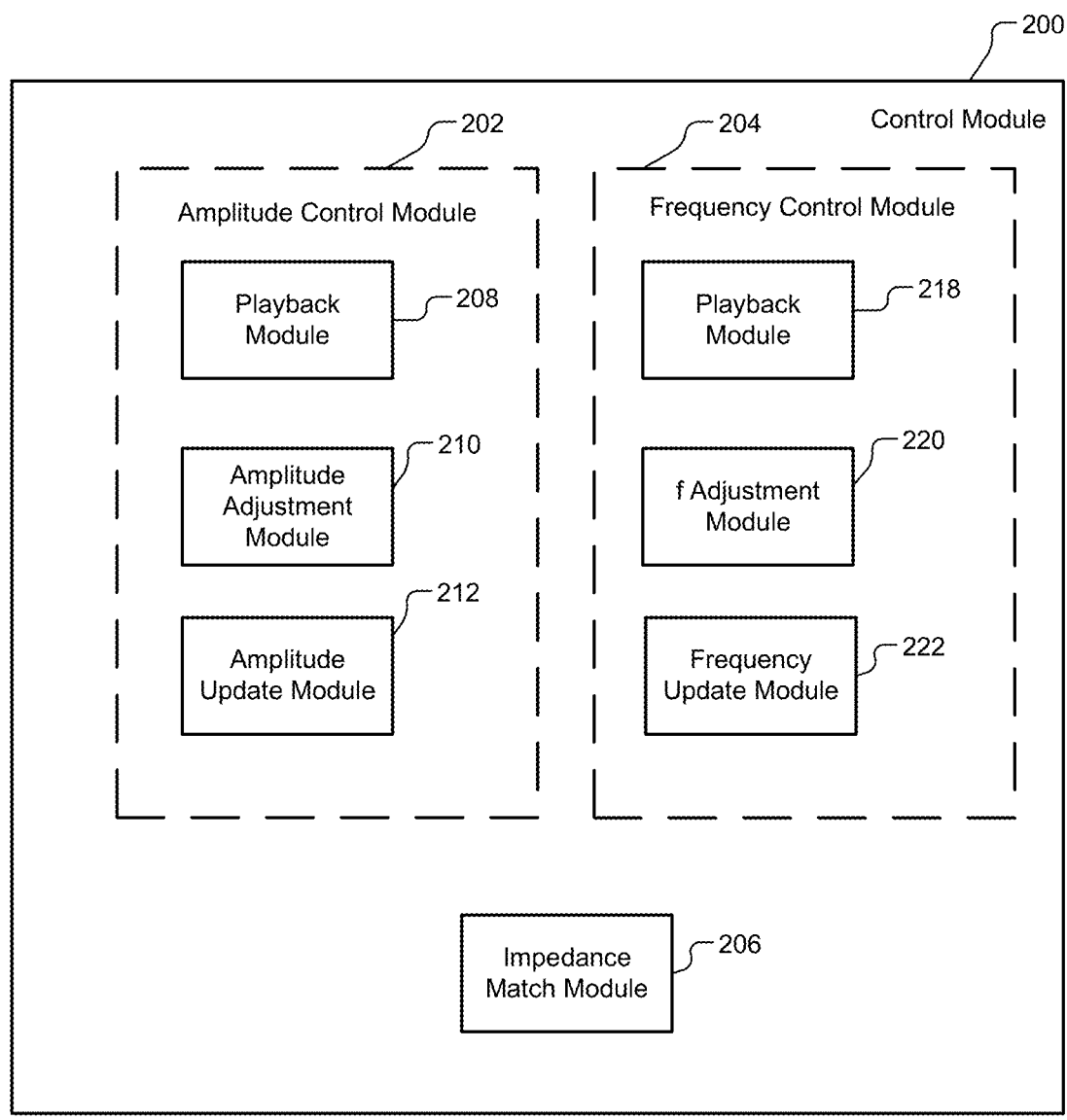
FIG. 18 is a functional block diagram of an example control module in accordance with various embodiments of the present disclosure.

FIG. 18 shows a control module 200. Control module 200 incorporates various components of FIGS. 1, 7, and 17. Control module 200 may include amplitude control module 202, frequency control module 204, and impedance match module 206. Amplitude control module 202 may include submodules, including playback module 208, amplitude adjustment module 210, and amplitude update module 212. Frequency control module 204 may include submodules, including playback module 218, frequency adjustment module 220, and frequency update module 222. In various embodiments, control module 200 includes one or a plurality of processors that execute code associated with the modules 202, 204, 206, 208, 210, 212, 218, 220, and 222. Operation of the modules 202, 204, 206, 208, 210, 212, 218, 220, and 222 is described below with respect to the method of FIG. 19-20.

Figure 19:
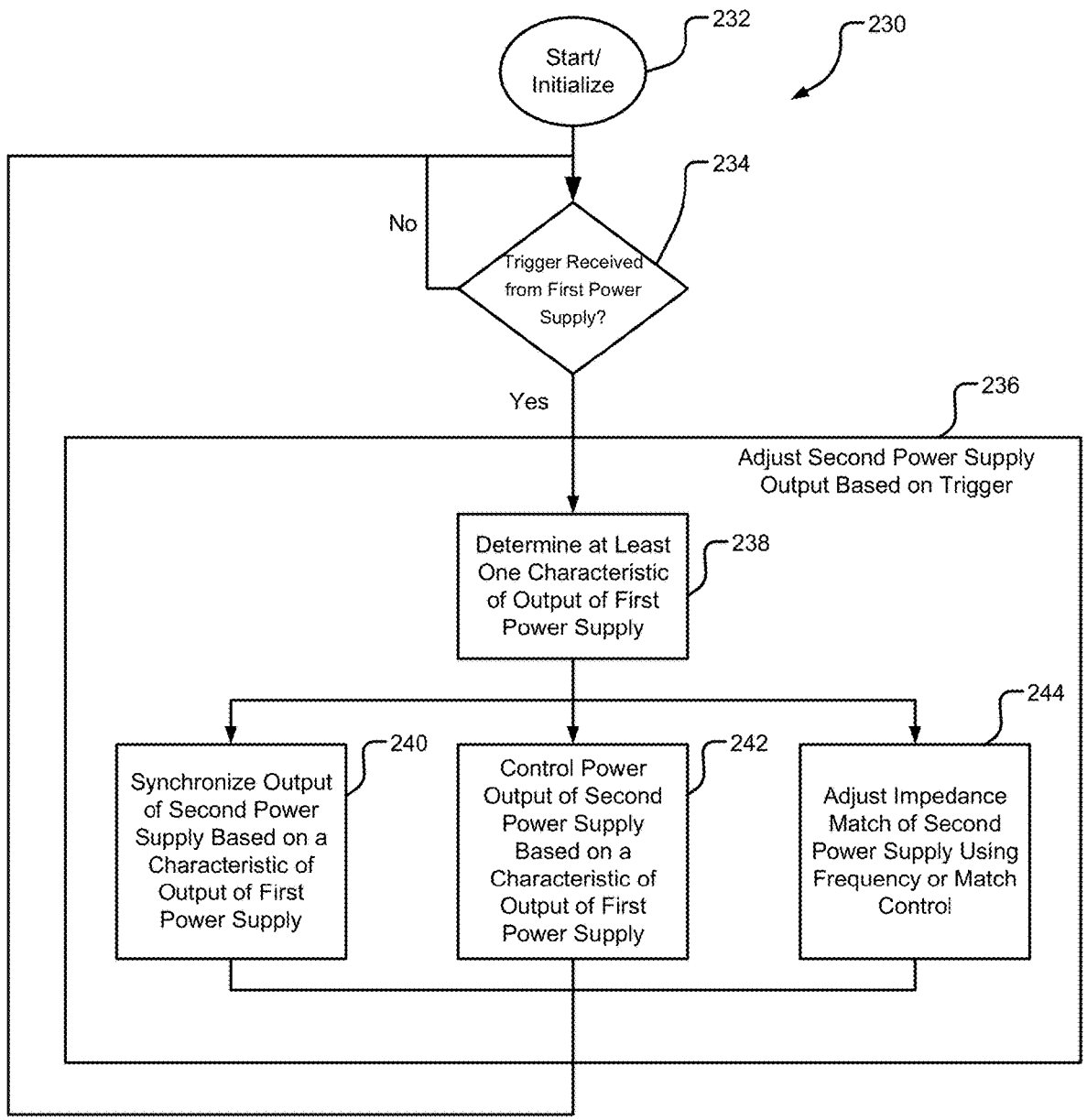
FIG. 19 is a flowchart for controlling a power delivery system according to various embodiments.
Figure 20:
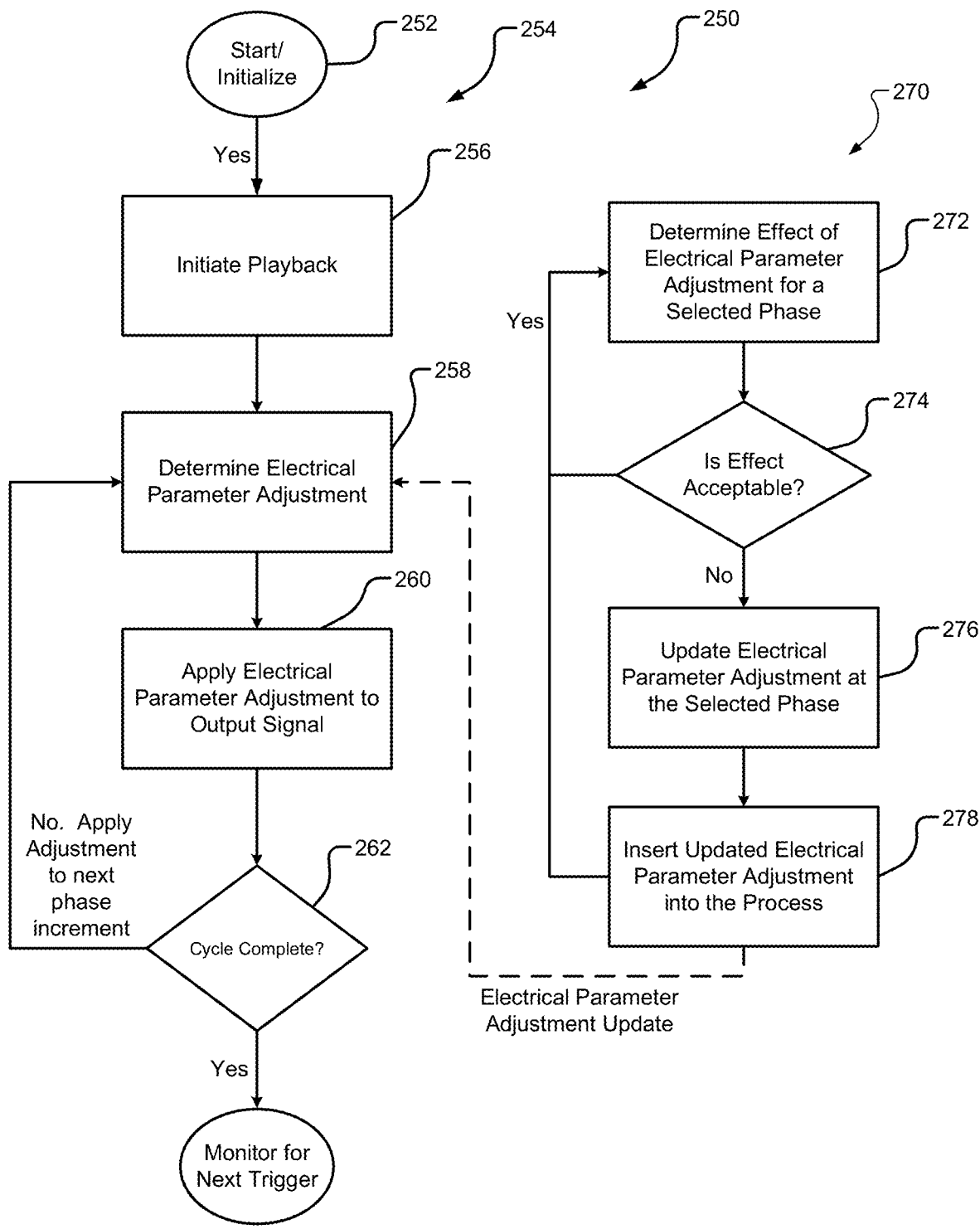
FIG. 20 is a flow chart describing operation of selected portions of the flow chart of FIG. 19.

For further defined structure of controller 20a of FIGS. 1, 7, and 17, see the below provided method of FIGS. 19-20 and the below provided definition for the term "module". The systems disclosed herein may be operated using numerous methods, an example control system method of which is illustrated in FIGS. 19-20. Although the following operations are primarily described with respect to the implementations of FIGS. 1, 7, and 17, the operations may be easily modified to apply to other implementations of the present disclosure. The operations may be iteratively performed. Although the following operations are shown and primarily described as being performed sequentially, one or more of the following operations may be performed while one or more of the other operations are being performed.

FIG. 19 depicts a flow diagram of the RF source generator or control method 230 described in the present disclosure.

Control begins at block 232 in which various parameters are initialized. Control proceeds to block 234 which monitors for a trigger event from a first power supply or RF generator, such as bias generator output signal $f_2$ or $V_{BIAS}$. As will be described in greater detail herein, a trigger event can be any event which allows suitable application of adjustments to electrical parameters of a second power supply or RF generator, such as source RF signal $f_1$ output by RF generator 12a. Block 234 continues to monitor whether a trigger event has occurred and loops back in a wait state until such an event has occurred. Upon detection of a trigger event, control proceeds to block 236, which adjusts the output of the second RF generator based on the triggering event. In block 236, control proceeds to block 238, which determines at least one characteristic of the output of the first power supply. Such a characteristic could be, by way of non-limiting example, peak detection, zero cross detection, phase detection, peak power detection, minimum power detection, or others, either measured via sensors or output by a control module. From block 238, control proceeds to one or more of blocks 240, 242, and 244.

At block 240, the controller synchronizes the output power of the second power supply based on one or more characteristics of the output of the first power supply. The synchronization can include, for example, when to initiate the RF output of the second power supply, with respect to the output of the first power supply. In various embodiments, by way of non-limiting example, the synchronization can occur with respect to a predetermined portion of the output of the first power supply, such as negative half wave of the first RF power supply. In various embodiments, however, synchronization can be with respect to other, predetermined portions of the first RF power supply waveform.

At block 242, the output power levels (amplitude) are controlled. In various configurations, the power output of the second RF generator or power supply is controlled by amplitude control module 202 of FIG. 18. Such power control can include modulating the source RF output to a lower level or blanking the source RF output. In other embodiments, controlling output power to a second power supply can include, by way of non-limiting example, increasing the output power (amplitude) in accordance with predetermined portions of the RF waveform of the first power supply.

Block 244 is implemented by impedance match module 206 and adjusts the impedance match between the second power supply and the load using one of frequency offset or hopping or controlling an actuator or variable reactance 35 in matching network 18a, both of which are described above. In various embodiments, block 244 may be implemented via frequency control module 204 of FIG. 18 when applying a frequency offset or hop. In various other embodiments, block 244 may be implemented in impedance match module 206 when implementing match control.

In various embodiments, block 240 is implemented via amplitude control module 202 of FIG. 18. However, in various embodiments, the functions of any of blocks 240, 242, 244 can be segregated into a particular one of amplitude control module 202, frequency control module 204, or impedance match module 206. In various other embodiments, the implementation of blocks 240, 242, 244 can be shared between amplitude control module 202, frequency control module 204, and impedance match module 206.

FIG. 20 depicts an expanded block diagram of various embodiments for controlling selected parameters of operation of RF source module 12a, where such parameters can include, but are not limited to, the frequency, power (amplitude), phase, frequency offset/hopping, or variable reactance control. The flow diagram of the electrical parameter control method 250 is initiated at block 252.

Once playback is initiated, control proceeds to blocks 254. At blocks 254, electrical parameter adjustments are applied relative to the trigger event. The adjustments are in various embodiments determined in accordance with an expected impedance fluctuation referenced to an event, such as sequencing of an RF signal output from bias RF generator 12b. Once the trigger signal is received, playback commences at block 256. Control then proceeds to block 258, which determines the adjustment to the electrical control parameter. Once the electrical control parameter adjustment is determined, typically in relation to the trigger event, control proceeds to block 260 which applies the adjustment to the RF signal output from RF generator 12a. Control proceeds to block 262 which determines if the playback sequence has completed. That is, at decision block 262, if the playback sequence is completed, control proceeds to monitor for a next trigger event, such as at decision block 234 of FIG. 19, where monitoring for a trigger event continues. If the playback sequence is not completed, control proceeds to block 258 where the electrical parameter adjustment is determined.

Also shown in FIG. 20 are blocks 270 for updating the electrical parameter adjustments of block 258. Blocks 270 may be implemented by respective update modules 44, 49 of controller 20a. In blocks 270, control commences at block 272 which determines whether an electrical characteristic, either sensed or otherwise determined, such as impedance, forward power or voltage, or reverse power or voltage, or phase, at a selected phase relative to, for example, the trigger event. Control proceeds to decision block 274 which determines whether the electrical characteristic is acceptable. That is, at decision block 274, the measured characteristic is compared to a threshold to determine if the electrical characteristic is acceptable or within a threshold for a given parameter adjustment. If the electrical characteristic is acceptable, control proceeds back to block 272. If the electrical characteristic is outside a predetermined range or threshold, control proceeds to block 276 which updates the electrical parameter adjustment at the selected phase in order to improve the value of the electrical characteristic. Once the electrical parameter adjustment at the selected phase is determined, control proceeds to block 278 which proceeds to insert the updated frequency offset into block 258 which determines the frequency offset.

In various embodiments, the trigger event, such as discussed with respect to block 254, is intended to synchronize source RF generator 12a with bias RF generator 12b so that electrical parameter adjustments can be appropriately applied relative to the bias RF signal, thereby effecting a desired change in the electrical characteristic. Synchronization between RF generators 12a, 12b can occur using control signal 30, 30', 31, or 33 which may provide a synchronization pulse or may replicate the RF signal output from RF generator 12b. In various other embodiments, synchronization with RF generator 12b can occur without a direct connection such as control signal 30 or other direct connection between RF generators 12a, 12b.

Synchronization without a direct connection can be achieved by analyzing the measured characteristics and phase-locking to a signal indicating the measured characteristics. For example, by analyzing signals X, Y output from sensor 16a, a signal indicating the measured characteristics can be generated. This signal can provide the appropriate trigger event. A signal indicating impedance fluctuation can be developed by performing a Fast Fourier transform (FFT) on the impedance fluctuation. In this configuration, the source RF generator 12a can effectively work as a stand-alone unit without connection to bias RF generator 12b.

The trigger events described in the various embodiments above are typically related to a periodicity of the trigger event. For example, the control signal received from bias RF generator 12b output control signal 30, 30' may repeat periodically in accordance with the RF signal output from RF generator 12b. Similarly, the above-discussed signal indicating an impedance fluctuation may also have a periodicity to it. Other triggering events need not be periodic. In various embodiments, a triggering event can be a non-periodic, asynchronous event, such as an arc detected within plasma chamber 32. In various other embodiments, a triggering event can be associated with control loop times of source RF generator 12a, referred to as the power control loop. When the trigger event is associated with the power control loop of source RF generator 12a, a signal that is typically much slower than the digital control loop for RF generator 12a pulses provides a triggering event.

In various embodiments, adjustment modules 42, 48 and corresponding block 258, in which the parameter adjustment is determined, can be implemented in a lookup table (LUT). The LUT can be statically determined by obtaining empirical data relating to the measured characteristics relative to the bias RF signal output from RF generator 12b and applied to load 32. When the LUT is determined statically, flow diagram 720 of FIG. 20 may not be applicable. In other in various embodiments, LUT can be determined dynamically as described with respect to blocks 270. One example of dynamically updating the electrical parameter adjustments includes automatic frequency tuning to determine a specific portion or bin of the frequency offset. The reflected power for that bin may be examined, such as using sensor 16a, and corrected. This correction provides the frequency offset for the selected bin.

In various embodiments, the electrical parameter adjustments can be applied in equal increments relative to the RF signal output by bias RF generator 12b, providing a consistent resolution over the range of electrical parameter adjustments. In various other embodiments, the resolution of the electrical parameter adjustments can vary. That is, the electrical parameter adjustments can be variably spaced in time so that more offsets may be applied for a given duration of the bias RF output signal, and fewer offsets may be applied for the same duration in a different portion of the bias RF output signal. The state-based approach herein thus increases resolution of the electrical parameter adjustments where necessary, such as when the electrical characteristic is more unstable for a given period, and decreases resolution of the electrical parameter adjustments where appropriate, such as where the measured electrical characteristic is more stable for a given period. A state-based approach can provide a more efficient implementation by reducing computational or processing overhead where appropriate. In various embodiments, the magnitude of each offset can vary.

In various embodiments, electrical parameter adjustments are provided using frequency modulation in the digital domain. In a digital domain, a Direct Digital Synthesizer (DDS) can implement the frequency offsets or hops. In various other embodiments, frequency offsets or hops can be introduced using various circuitry. Such circuitry can include a voltage-controlled oscillator (VCO) to add frequency offsets to the RF signal output from RF generator 12a.

In various other embodiments, a feedback control loop within RF generator 12a can provide information for applying the offset frequencies and can apply frequencies dynamically, without reference to predetermined offsets. In order to implement such a system, existing frequency tuning methods, such as servo-based frequency tuning or dynamic frequency impedance information, are utilized. This impedance information can be used to prospectively adjust the frequency offset in order to correspondingly reduce the impedance fluctuations.

The various embodiments described above can be discussed with respect to dissipation of each various embodiment. Dissipation, in turn, varies in accordance with the reflected or reverse power $P_{REV}$. By minimizing reflected power, stress on the power supply components can be in turn reduced. Reflected power, in turn, correlates to the average reflection ratio. Accordingly the chart below indicates the reflection ratio of each embodiment, including a conventional tuning approach.

| Tuning Approach | Ave. Reflection Ratio |
| --- | --- |
| Conventional approach | 0.54 |
| Tuning to a predetermined portion of the $V_{BIAS}$ waveform (such as a negative half cycle) | 0.64 |
| Power modulation (such as blanking) | 0.30 |
| Frequency offset/hopping | 0.04 |

From the above, it can be seen that the power modulation and frequency offset approaches provide a relative improvement to the standard method of reducing reflected power. Tuning to a predetermined portion of the bias waveform may not reduce reflected power over the prior art approach, but it may offer additional actuators for controlling plasma behavior.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

In this application, apparatus elements described as having particular attributes or performing particular operations are specifically configured to have those particular attributes and perform those particular operations. Specifically, a description of an element to perform an action means that the element is configured to perform the action. The configuration of an element may include programming of the element, such as by encoding instructions on a non-transitory, tangible computer-readable medium associated with the element.

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A radio frequency (RF) generator comprising:
a first RF power source; and
a RF power controller coupled to the first RF power source, the RF power controller generating a control signal to vary a first RF output from the first RF power source to a load, the RF power controller configured to control at least one of the first RF output or a match network actuator in a first predetermined manner over a portion of a negative voltage segment of a second RF output from a second RF power source,
wherein the first predetermined manner includes controlling at least one of a power of the first RF output, a frequency of the first RF output, or the match network actuator associated with the first RF output.

2. The RF generator of claim 1, wherein the first RF output is a source RF output signal applied to the load and the second RF output is a bias RF output signal applied to the load.

3. The RF generator of claim 1, wherein the RF power controller receives a synchronization signal that varies in accordance with the second RF output and wherein the synchronization signal indicates the portion of the negative voltage segment of the second RF output.

4. The RF generator of claim 1, wherein the RF power controller increases the power of the first RF output during the portion of the negative voltage segment of the second RF output.

5. The RF generator of claim 1, wherein the RF power controller turns off the RF power source during other than the portion of the negative voltage segment of the second RF output applied to the load.

6. The RF generator of claim 1, wherein the RF power controller applies a power adjustment to the power of the first RF output in accordance with a timing that varies in accordance with a trigger signal, wherein the trigger signal indicates a relative position of the portion of the negative voltage segment.

7. The RF generator of claim 6, wherein the power adjustment includes a plurality of power adjustments that the RF power controller applies to the first RF output in a predetermined order and timing in accordance with the trigger signal.

8. The RF generator of claim 6, wherein the power adjustment varies in accordance with the power delivered by the RF power source.

9. The RF generator of claim 6, wherein the RF power controller further comprises a playback module, the playback module configured to detect the trigger signal, the playback module initiating introduction of the power adjustment to RF output.

10. The RF generator of claim 1, wherein the RF power controller controls the frequency by introducing a frequency offset to the first RF output in accordance with a timing that varies in accordance with a trigger signal, wherein the trigger signal indicates a relative position of the portion of the negative voltage segment.

11. The RF generator of claim 10, wherein the frequency offset includes a plurality of frequencies that the RF power controller applies to the first RF output in a predetermined order and timing in accordance with the trigger signal.

12. The RF generator of claim 10, wherein the frequency offset varies in accordance with an intermodulation distortion introduced by the second RF output.

13. A radio frequency (RF) generator comprising:
a first RF generator including a first power source generating a first RF signal applied to a load; and
a second RF generator including:
a second power source generating a second RF signal applied to the load; and
a power controller coupled to the second power source, the power controller configured to respond to a trigger signal and to generate a RF control signal and an actuator control signal, wherein the RF control signal adjusts an electrical parameter of the second RF signal and wherein the actuator control signal adjusts an actuator of a match network associated with the second RF signal,
wherein the trigger signal indicates a first portion of a negative voltage segment of the first RF signal, and wherein the electrical parameter includes at least one of a power of the second RF signal or a frequency of the second RF signal.

14. The RF generator of claim 13, wherein the second RF signal is a source signal applied to the load and the first RF signal is a bias signal applied to the load and wherein the load is a plasma chamber.

15. The RF generator of claim 13, wherein the trigger signal varies in accordance with the first RF signal and wherein the power controller is configured to vary the RF control signal to control the electrical parameter at a position of the second RF signal relative to the first RF signal.

16. The RF generator of claim 13, wherein an adjustment to the electrical parameter includes a sequence of adjustments that the power controller applies to the second RF signal in accordance with the first predetermined segment.

17. The RF generator of claim 16, wherein the power controller introduces the sequence of adjustments to the second RF signal with a fixed or variable interval between each one of the sequence of adjustments.

18. The RF generator of claim 13, wherein the power controller updates adjustments in accordance with a property of the second RF signal.

19. The RF generator of claim 13, wherein the power controller generates the trigger signal in accordance with an impedance of the load.

20. The RF generator of claim 13, wherein the second RF generator further comprises a sensor for measuring an impedance at the load, the sensor generating a signal from which impedance fluctuations in the load are determined.

21. The RF generator of claim 13, wherein the first predetermined segment includes a negative voltage portion of the first RF signal.

22. The RF generator of claim 21 wherein the RF control signal at least one of increases the power of the second RF signal during the portion of the negative voltage segment of the second RF signal or turns off the second power source during other than the portion of the negative voltage segment of the second RF signal applied to the load.

23. The RF generator of claim 13, wherein the RF control signal introduces a frequency offset to the second RF signal in accordance with the portion of the negative voltage segment.

24. A non-transitory computer-readable medium storing instructions, the instructions comprising:

controlling a first RF generator to output a first RF output signal; and generating a control signal, the control signal varying an electrical characteristic of the first RF output signal in accordance with a portion of the negative voltage segment of a second RF output signal from a second RF power source, and wherein the electrical characteristic includes at least one of a power of the first RF output signal or a frequency of the first RF output signal.

25. The non-transitory computer-readable medium of claim 24 wherein varying the electrical characteristic of the first RF output signal further comprises varying the power of the first RF output signal.

26. The non-transitory computer-readable medium of claim 25 wherein varying the electrical characteristic of the first RF output signal further comprises varying a frequency offset in accordance with the first predetermined segment of a second RF output signal.

27. The non-transitory computer-readable medium of claim 25 further comprising introducing the frequency offset into the first RF output signal in accordance with the portion of the negative voltage segment of a second RF output signal or an impedance fluctuation in a load receiving the first RF output signal.

28. The non-transitory computer-readable medium of claim 27, further comprising determining where in the first RF output signal to vary the electrical characteristic of the first RF output signal.

29. The non-transitory computer-readable medium of claim 24, further comprising coupling the first RF output signal to a source electrode of a plasma chamber and coupling the second RF output applied to bias electrode of a plasma chamber.

30. The non-transitory computer-readable medium of claim 24 further comprising updating an electrical parameter adjustment in accordance with one of the output of the second RF output or an impedance fluctuation in a load coupled to the first RF generator.

31. The non-transitory computer-readable medium of claim 24 further comprising updating an electrical parameter adjustment in accordance with phase-locking to impedance fluctuations in a load.

* * * * *